(12) United States Patent
Ito et al.

(10) Patent No.: US 8,148,717 B2
(45) Date of Patent: Apr. 3, 2012

(54) MANUFACTURING METHOD FOR SEMICONDUCTOR DEVICE AND SEMICONDUCTOR DEVICE

(75) Inventors: Takayuki Ito, Kanagawa-ken (JP);
Yusuke Oshiki, Kanagawa-ken (JP);
Kouji Matsuo, Kanagawa-ken (JP);
Kenichi Yoshino, Kanagawa-ken (JP);
Takaharu Itani, Kanagawa-ken (JP);
Takuo Ohashi, Kanagawa-ken (JP);
Toshihiko Iinuma, Kanagawa-ken (JP);
Kiyotaka Miyano, Tokyo (JP);
Kunihiro Miyazaki, Oita-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/929,504

(22) Filed: Jan. 28, 2011

(65) Prior Publication Data
US 2011/0127578 A1 Jun. 2, 2011

Related U.S. Application Data

(62) Division of application No. 12/483,728, filed on Jun. 12, 2009, now Pat. No. 7,902,030.

(30) Foreign Application Priority Data

Jun. 13, 2008 (JP) .................... 2008-156033
Apr. 17, 2009 (JP) .................... 2009-101147

(51) Int. Cl.
*H01L 29/06* (2006.01)
*H01L 31/0328* (2006.01)
*H01L 31/0336* (2006.01)
*H01L 31/072* (2012.01)
*H01L 31/109* (2006.01)

(52) U.S. Cl. ........................ 257/19; 257/190
(58) Field of Classification Search ............... 257/190, 257/19
See application file for complete search history.

(56) References Cited

U.S. PATENT DOCUMENTS

| | | | |
|---|---|---|---|
| 2005/0066887 A1* | 3/2005 | Saitoh et al. ............. | 117/88 |
| 2005/0285203 A1 | 12/2005 | Fukutome et al. | |
| 2006/0128105 A1 | 6/2006 | Ouyang et al. | |
| 2006/0231826 A1 | 10/2006 | Kohyama | |
| 2007/0196989 A1 | 8/2007 | Kim et al. | |
| 2009/0098665 A1 | 4/2009 | Bu et al. | |

FOREIGN PATENT DOCUMENTS

| | | |
|---|---|---|
| JP | 2004-63574 | 2/2004 |
| JP | 2007-36205 | 2/2007 |

* cited by examiner

*Primary Examiner* — Thien F Tran
(74) *Attorney, Agent, or Firm* — Finnegan, Henderson, Farabow, Garrett & Dunner, L.L.P.

(57) ABSTRACT

A manufacturing method for semiconductor device includes: forming an opening, in a surface of a semiconductor substrate being composed of first atom, the opening having an opening ratio y to an area of the surface of the semiconductor substrate ranging from 5 to 30%; forming an epitaxial layer in the opening, the epitaxial layer being made of a mixed crystal containing a second atom in a concentration ranging from 15 to 25%, and the second atom having a lattice constant different from a lattice constant of the first atom; implanting impurity ion into the epitaxial layer; and performing activation annealing at a predetermined temperature T, the predetermined temperature T being equal to or higher than 1150° C. and satisfies a relationship of $y \leqq 1E-5 \exp(21541/T)$.

7 Claims, 17 Drawing Sheets

| IONIC SPECIES | | IMPURITY CONCENTRATION AT Si/SiGe INTERFACE | |
|---|---|---|---|
| | $BF_2$ | 5.00E+15 | |
| | B | 2.00E+15 | |
| | As | 2.00E+15 | |
| | P | 5.00E+14 | |
| | Ge | 2.00E+15 | |
| | | ACCELERATION ENERGY (keV) | IMPLANTED DOSAGE ($cm^{-2}$) |
| | In | 5 keV | 1.00E+15 |
| | Sb | 5 keV | 1.00E+15 |

MANUFACTURING METHOD FOR SEMICONDUCTOR DEVICE AND SEMICONDUCTOR DEVICE

CROSS-REFERENCE TO RELATED APPLICATION

This is a division of application Ser. No. 12/483,728, filed Jun. 12, 2009 now U.S. Pat. No. 7,902,030, which is incorporated herein by reference.

This application is based upon and claims the benefit of priority from the prior Japanese Patent Applications No. 2008-156033 filed on Jun. 13, 2008, and No. 2009-101147 filed on Apr. 17, 2009, the entire contents of which are incorporated herein by reference.

BACKGROUND OF THE INVENTION

The present invention relates to a manufacturing method for a semiconductor device used, for example, for implanting impurity ions into a semiconductor substrate and activation annealing, and a semiconductor device.

In recent years, with a growing requirement for high-performance semiconductor devices, an approach of applying a stress to a channel region has been employed in order to increase drain current of a transistor.

The method of applying a stress may include a method of forming a film with a high stress, after formation of a gate electrode, and applying a stress to a channel region. The method may also include, for example, a method of etching a source/drain region in a Si-MOSFET (Metal Oxide Semiconductor Field Effect Transistor) and epitaxially growing, in the region, a mixed crystal layer having a lattice constant different from that of a Si substrate.

In the latter method, as the mixed crystal layer, a SiGe layer is formed in order to apply a compressive stress to the channel region in the transverse direction in the case of a p-channel MOSFET (hereinafter, referred to as a "p-MOSFET"). A Si:C layer is formed in order to apply a tensile stress to the channel region in the transverse direction in the case of an n-channel MOSFET (hereinafter, referred to as an "n-MOSFET"). In both cases, as the contained Ge or C is higher, the mixed crystal layer is closer to the channel region, and the volume of the mixed crystal layer is larger (thicker film), the stress application to a channel layer is more effective as described, for example, in Japanese Patent Application Laid-Open No. 2007-36205 (claim 1, paragraph [0041] and so on).

However, if a mixed crystal layer containing Ge or C in a high concentration grows to a thickness greater than a critical film thickness, a crystal defect occurs to relax the stress. There is therefore a problem that it is difficult to secure a sufficient process margin for applying a high stress to a channel region while suppressing crystal defects.

On the other hand, improvement in performance of a semiconductor device by miniaturization of elements is studied. Since influences of parasitic resistance and short channel effects of MOSFETs constituting a semiconductor device increase with the miniaturization, it is required that an impurity diffusion layer be formed to have low resistance and to be shallow (shallow junction formation).

Heat treatment for impurity activation needs to be performed at a high temperature in order to reduce the resistance of an impurity diffusion layer. However, a conventional RTA (Rapid Thermal Anneal) diffuses impurities. It is therefore difficult to achieve both resistance reduction and shallow junction formation. To address this difficulty, an annealing method using a flash lamp or a laser capable of instantaneously supplying thermal energy is studied as described in Japanese Patent Application Laid-Open No. 2004-63574 (paragraph [0006] and so on).

However, a problem with this method is that instantaneous heating of the surface of a semiconductor substrate having semiconductor elements formed thereon increases the thermal stress inside the semiconductor substrate, causing dislocation and crystal defects to easily occur.

SUMMARY

According to an aspect of the present invention, there is provided a manufacturing method for semiconductor device comprising: forming an opening, in a surface of a semiconductor substrate being composed of first atom, the opening having an opening ratio y to an area of the surface of the semiconductor substrate ranging from 5 to 30%; forming an epitaxial layer in the opening, the epitaxial layer being made of a mixed crystal containing a second atom in a concentration ranging from 15 to 25%, and the second atom having a lattice constant different from a lattice constant of the first atom; implanting impurity ion into the epitaxial layer; and performing activation annealing at a predetermined temperature T, the predetermined temperature T being equal to or higher than 1150° C. and satisfies a relationship of $y \leq 1E\text{-}5\exp(21541/T)$ According to an aspect of the present invention, there is provided a manufacturing method for semiconductor device comprising: forming a first opening and a second opening in a surface of a semiconductor substrate being composed of first atom, the second opening having an opening area larger than the first opening, and an opening ratio of a total area of the first opening and the second opening to an area of the surface of the semiconductor substrate ranging from 5 to 30%; forming epitaxial layers in the first opening and the second opening, the epitaxial layers being made of a mixed crystal containing a second atom, and the second atom having a lattice constant different from a lattice constant of the first atom; masking the epitaxial layer in the second opening; implanting impurity ion into the semiconductor substrate, and a concentration of the impurity ion at an interface between the epitaxial layer and the semiconductor substrate being equal to or less than $1E18\ cm^{-3}$ at least in the second opening; and performing activation annealing at a temperature equal to or higher than 1150° C. and equal to or lower than a melting point of the epitaxial layer and at a heating/cooling rate equal to or higher than $10^{5}$° C./sec.

According to an aspect of the present invention, there is provided a semiconductor device comprising: a semiconductor substrate being composed of first atom; an opening formed in a surface of the semiconductor substrate and the opening having a ratio of the opening area to an area of the surface of the semiconductor substrate ranging from 5 to 15%; and an epitaxial layer formed in the opening, the epitaxial layer being made of a mixed crystal containing a second atom in a concentration ranging from 1 to 25%, the second atom having a lattice constant different from a lattice constant of an atom constituting the semiconductor substrate.

DETAILED DESCRIPTION

Figure 1A:
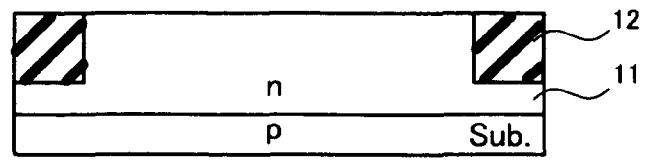
FIGS. 1A to 1I are sectional views showing semiconductor manufacturing processes according to an embodiment of the invention.

Reference will now be made in detail to the present embodiment of the invention, an example of which is illustrated in the accompanying drawings. Wherever possible, the same reference numbers will be used throughout the drawing to refer to the same or like parts.

First Embodiment

FIGS. 1A to 1I are sectional views of semiconductor manufacturing processes of the present embodiment. As shown in FIG. 1A, on a semiconductor substrate (Sub.) made of p-type Si, an n-MOSFET region is masked, for example, with a photoresist film. A Group V element serving as an n-type impurity, such as phosphorus (P), is ion implanted to form an n-well layer 11. Subsequently, a trench (not shown) is formed around the n-well layer 11 by photolithography and RIE (Reactive Ion Etching).

An insulating film made of $SiO_2$ or the like is deposited in the formed trench, for example, by an LPCVD (Low. Pressure Chemical Vapor Deposition) method. This deposition fills up the inside of the trench with the film. Further, the insulating film deposited on the surface of the n-well layer 11 on the semiconductor substrate (Sub.) is removed by a CMP (Chemical Mechanical Polishing) method to form an element isolation region 12 of an STI (Shallow Trench Isolation) structure.

Figure 1B:
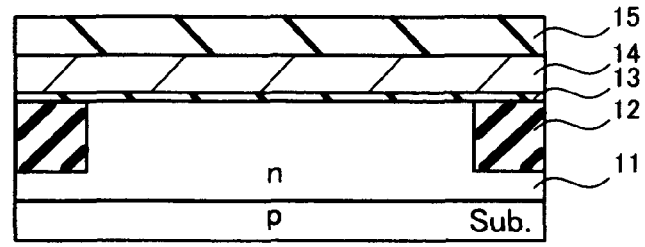

Subsequently, as shown in FIG. 1B, an insulating film 13, such as a thermal oxynitride film (Si oxynitride film), which will serve as a gate insulating film, is formed on the surface of the semiconductor substrate (Sub.) As the insulating film 13, an oxide film (Si oxide film) may be used or a metal oxide film containing hafnium (Hf) aluminum (Al) or the like may also be used. Then, a poly-Si film 14, which will serve as a gate electrode, is deposited on this insulating film 13, for example, by the LPCVD method. The film that will serve as a gate electrode is not limited to a poly-Si film, but may contain a metal material.

Figure 1C:
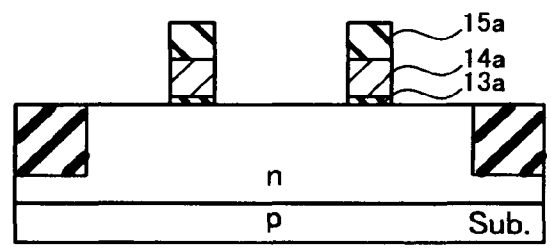

Further, a Si nitride film ($Si_3N_4$) 15 serving as a hard mask is formed on the poly-Si film 14 for example, by the LPCVD method. Then, as shown in FIG. 1C, an offset insulating film 15a, a gate electrode 14a and a gate insulating film 13a are formed by photolithography and RIE.

A Si oxide film is formed, for example, by an LPCVD method so as to cover the gate insulating film 13a, the gate electrode 14a and the offset insulating film 15a. The Si oxide film 16 may be replaced by a Si nitride film or a layered structure of a Si oxide film and a Si nitride film.

Figure 1D:
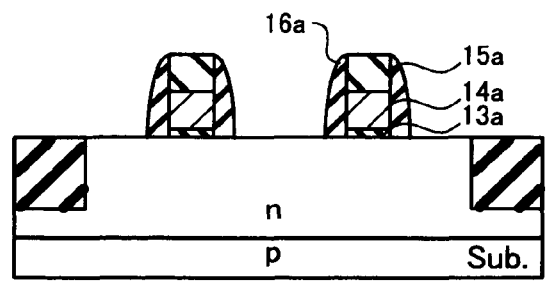

As shown in FIG. 1D, the Si oxide film is etched back by an anisotropic dry etching method, such as RIE, to form a gate side wall 16a on the sides of the gate insulating film 13a, the gate electrode 14a and the offset insulating film 15a.

Figure 1E:
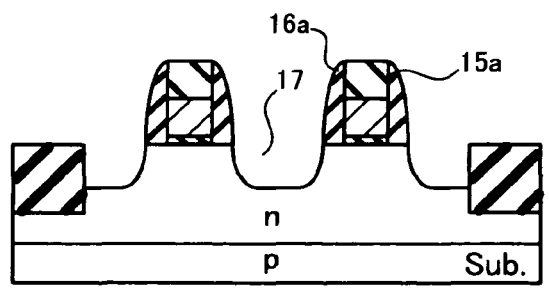

As shown in FIG. 1E, recess etching to dig the surface of the semiconductor substrate (Sub.) is performed with the offset insulating film 15a on the gate electrode 14a and the gate side wall 16a used as a mask, thereby forming an opening (recess region) 17, for example, having an opening ratio of 10% at a depth of about 80 nm. The recess etching maybe performed without forming agate side wall. A natural oxide film on the surface of the semiconductor substrate (Sub.) is removed by cleaning processing using diluted hydrofluoric acid.

Figure 1F:
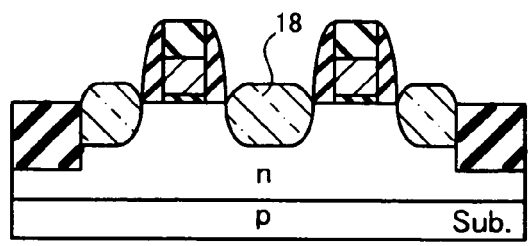

As shown in FIG. 1F, a mixed crystal SiGe layer 18, which is an epitaxial layer made of Si and Ge having a lattice constant greater than that of Si is epitaxially grown in the opening 17 in order to apply a compressive stress to the channel region. The concentration of Ge in the mixed crystal SiGe layer 18 is, for example, 25%, and the concentration gradient is formed in the mixed crystal SiGe layer 18 such that the concentration of Ge increases from the surface of the opening 17 toward an intermediate area, and decreases from the intermediate area toward the surface of the mixed crystal SiGe layer. Specifically, the concentration gradient is formed in a manner that the concentration of Ge contained in the mixed crystal SiGe layer 18 is in a range from 0 to 30% in an area close to the surface of the opening 17 (bottom area), in a range from 30 to 15% in the intermediate area, and in a range from 15 to 0% in an area close to the surface of the mixed crystal SiGe layer 18 (surface area) Such a concentration gradient of Ge can be formed by gradually varying the gas flow rate of $GeH_4$, which is a film formation gas used in epitaxial growth.

In this way, a concentration gradient in which the concentration of Ge gradually increases toward the bottom area of the mixed crystal SiGe layer 18 is formed, so that the stress due to SiGe is gradually and effectively applied to the channel region while suppressing occurrence of dislocation to the periphery and crystal defects caused by the lattice mismatch with the semiconductor substrate (Sub.) of Si. A concentration gradient in which the concentration of Ge decreases toward the surface area of the mixed crystal SiGe layer 18 is formed, so that the surface of the mixed crystal SiGe layer 18 has a Si concentration that allows a silicide reaction to be easily obtained in order to achieve an excellent contact between a metal electrode and a source/drain region.

Figure 1G:
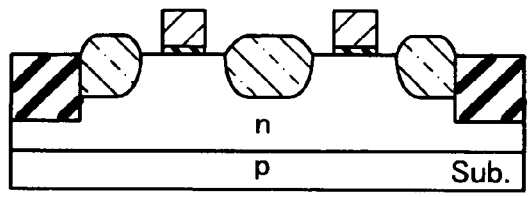

As shown in FIG. 1G, the gate side wall 16a and the offset insulating film (hard mask) 15a are once removed by a chemical, and a Group III element serving as a p-type impurity, such as $BF_2$, is implanted into the p-MOSFET region with the n-MOSFET region masked, for example, with a photoresist film. Conditions of ion implantation of $BF_2$ are set, for example, to acceleration energy of 2 keV and a dosage of $1 \times 10^{15}$ cm$^{-2}$.

Figure 1H:
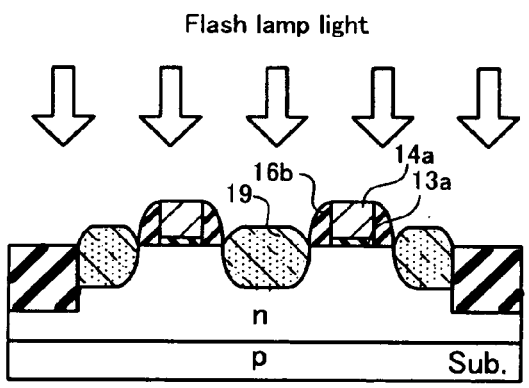

Subsequently, as shown in FIG. 1H, a gate side wall 16b of a multilayered structure made up of a Si oxide film and a Si nitride film is formed on the side of the gate electrode 14a and the gate insulating film 13a, in the same manner as the gate side wall 16a. With the gate side wall 16b used as a mask, doping of a p-type impurity containing, for example, boron (B) is performed by an ion implantation method under conditions where, for example, acceleration energy is 1 keV and a dosage is $3 \times 10^{15}$ cm$^{-2}$, thereby forming an impurity implantation layer 19 in the mixed crystal SiGe layer 18.

Then, annealing is performed, for example, at 1050° C. by spike RTA (Rapid Thermal Annealing) using a halogen lamp. Boron (B) implanted into the impurity implantation layer 19 is substituted at the lattice site and is incorporated by this annealing. Therefore, the ion implantation causes crystal recovery to be achieved in the impurity implantation layer 19 where crystal defects have occurred, resulting in electrical activation.

Figure 2A:
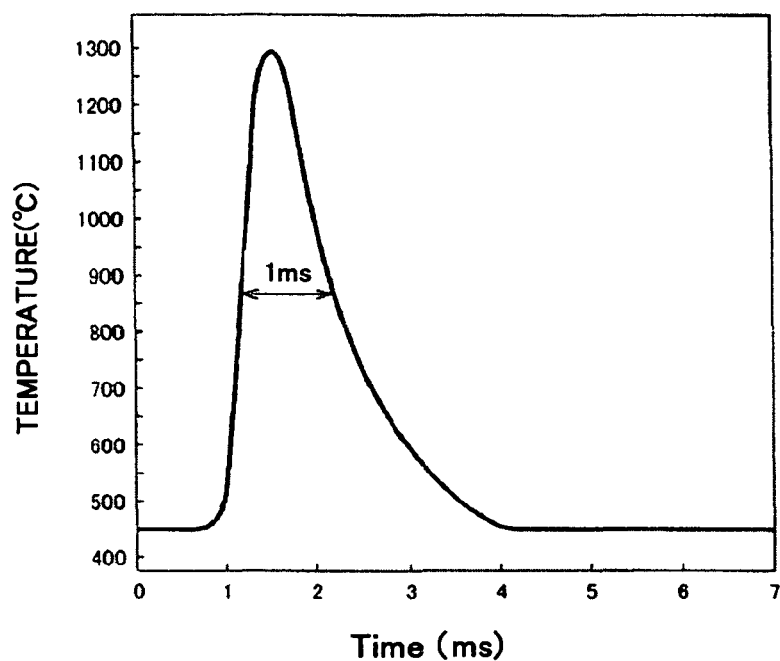
FIG. 2A is a temperature profile of activation annealing according to an embodiment of the invention.

Annealing for activation is performed using a flash lamp having a temperature profile with a heating/cooling rate of $10^{5}$° C./sec or higher as shown in FIG. 2A.

Figure 2B:
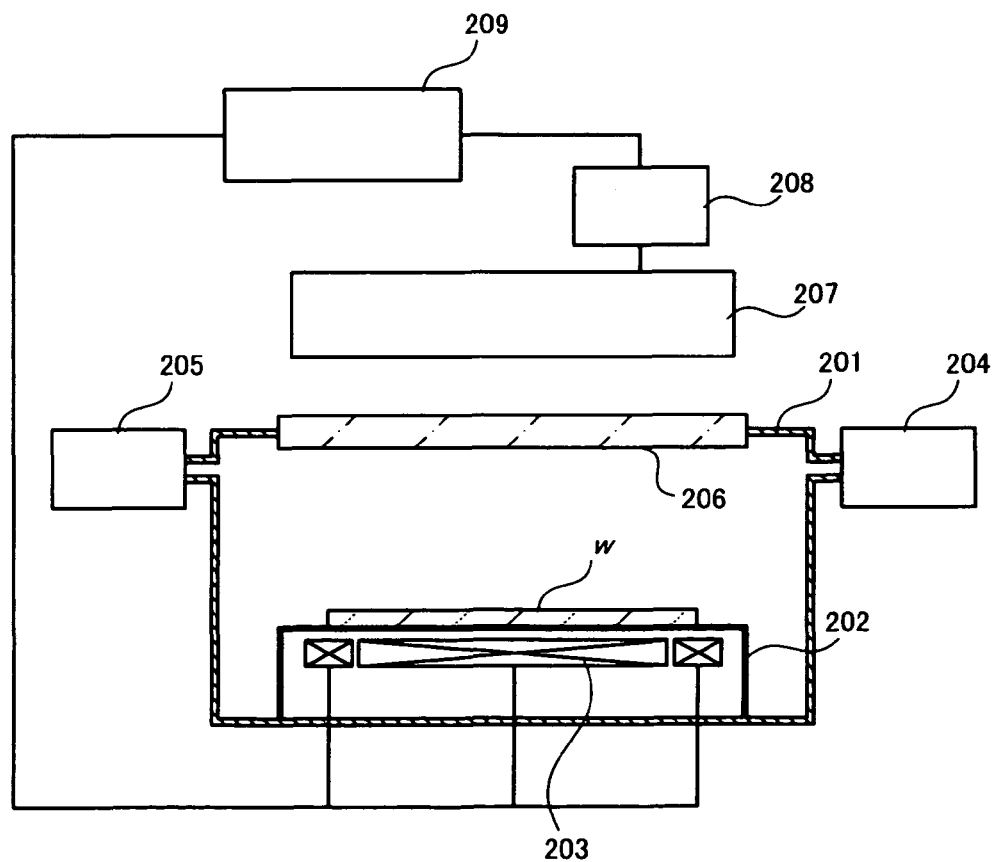
FIG. 2B is the configuration of a heat treatment apparatus used in activation annealing according to an embodiment of the invention.

In this case, for example, a heat treatment apparatus as shown in FIG. 2B is used. The heat treatment apparatus is provided with a heat treatment chamber 201 into which a semiconductor substrate w is loaded and in which activation annealing is performed, and a substrate stage 202 on which the semiconductor substrate w is placed. A heating source 203 for supplementarily heating the semiconductor substrate w from its back face is disposed in the substrate stage 202. A gas supply mechanism 204 for supplying inert gas and the like into the heat treatment chamber 201 and a gas discharge mechanism 205 for discharging gas are provided. A transparent window 206 is disposed in an upper port ion of the heat treatment chamber 201.

Disposed above the heat treatment chamber 201 and apart therefrom is a light source (flash lamp) 207 for heating the semiconductor substrate w by applying emitted light into the heat treatment chamber 201 through the transparent window 206 while the airtightness of the heat treatment chamber 201 is maintained. A power source 208 is connected to the light source (flash lamp) 207, and a control system 209 for controlling the pulse width and irradiation energy of the light source (flash lamp) 207 and the output of the heating source 203 is further connected. A laser may also be used as the light source.

In such a heat treatment apparatus, the semiconductor substrate w is loaded into the heat treatment chamber 201, and is placed on the substrate stage 202. After supplemental heating by the heating source 203, the power source 208 is controlled to be set under predetermined conditions by the control system 209, and the semiconductor substrate w is irradiated with irradiation light from the light source (flash lamp) 207 through the transparent window 206 so that the surface temperature of the semiconductor substrate w measured, for example, by a high-speed pyrometer is 1250° C., thus performing activation annealing.

Figure 3:
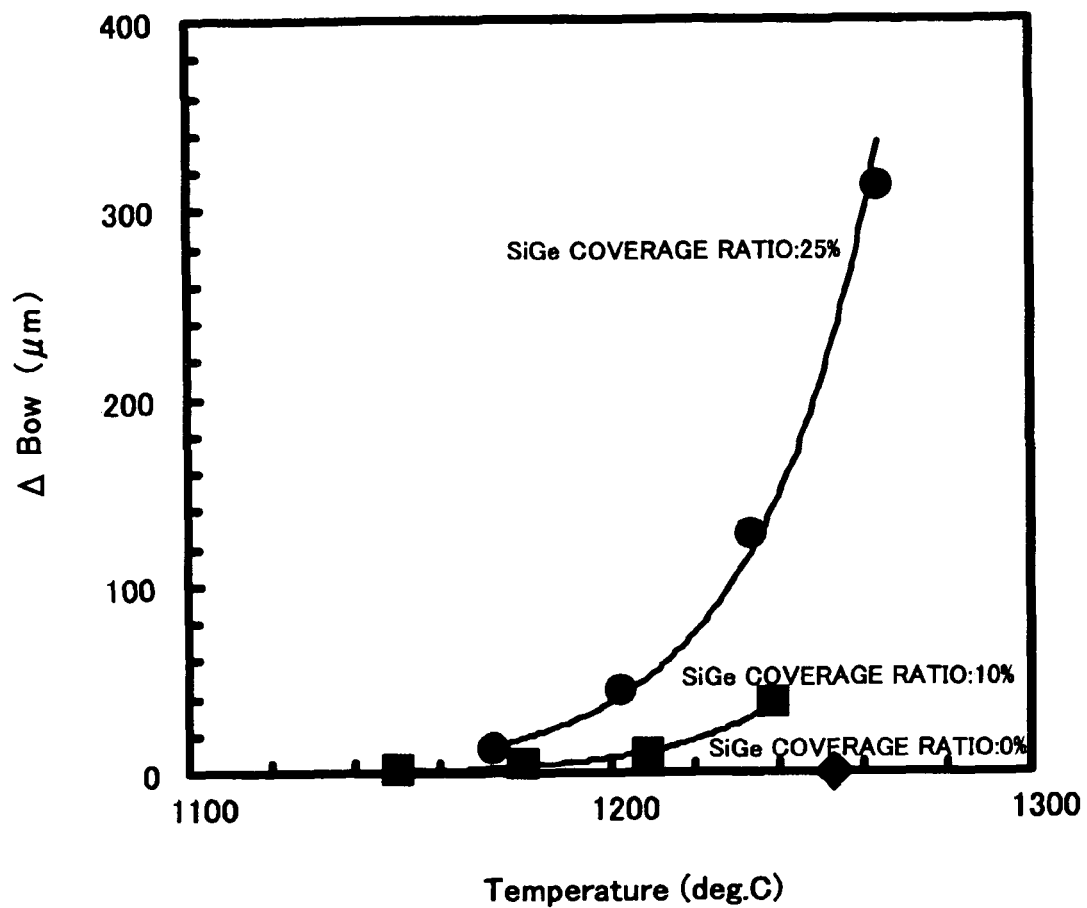
FIG. 3 is the relationship between the plastic deformation amount of a wafer and the activation annealing temperature according to an embodiment of the invention.

In activation annealing, when a mixed crystal SiGe layer is formed, the plastic deformation amount ΔBow of the wafer (semiconductor substrate) increases as the temperature of the activation annealing increases as shown in FIG. 3. The variation of the plastic deformation amount is further increased with the increase of the opening ratio (the coverage ratio of the mixed crystal SiGe layer) to the semiconductor substrate, and increased with the increase of the concentration of Ge in the mixed crystal SiGe layer.

In the wafer having a large amount of plastic deformation after activation annealing, the inside of the element region forming a pattern is observed by an optical microscope after the surface structure on the wafer is removed with hydrofluoric acid. As a result, pits with high density are observed in the mixed crystal SiGe layer. Based on this observation, the increased amount of the plastic deformation of the wafer with the increase of the activation annealing temperature can be regarded as a phenomenon induced by dislocation and crystal defects occurring with high density in the mixed crystal SiGe layer. In addition, the increase of the opening ratio of the mixed crystal SiGe layer results in the increase of the pit area, and therefore is considered to lead to plastic deformation of the wafer.

Note that the term "element region" in the present embodiment refers to a region in which semiconductor elements, such as a MOSFET, are formed. This term may also refer to a region electrically connected to an interconnection layer formed in an upper layer of this region. Accordingly, the term "non-element region" refers to a region that is not electrically connected to the interconnection layer formed in an upper layer.

The plastic deformation of the wafer occurring after activation annealing is further induced by a feature of the activation annealing, that is, extremely short-time annealing where the heating/cooling rate is $10^{5}$° C./sec or higher. This is because the temperature difference between the front and back surfaces of the wafer becomes larger during the activation annealing, which causes a heat stress in the thickness direction of the wafer. Specifically, while a flash lamp is turned on, only the outermost layer part of the wafer is exposed to high temperature and expands, temporarily deforming the wafer into a convex shape. However, when dislocation occurs in the outermost layer part, the stress is relieved. The crystal surface in the outermost layer part deviates, and therefore the wafer is deformed into a concave shape. Since the restoring force has been lost, the bowed state of the wafer remains, resulting in the plastic deformation.

On the other hand, one reason why the amount of plastic deformation of the wafer depends on the opening ratio of the mixed crystal SiGe layer and the concentration of Ge in the mixed crystal SiGe layer is that the rate of lattice mismatch with Si constituting the semiconductor substrate increases with the increase of the concentration of Ge, resulting in the increase of the amount of stress in the vicinity of the mixed crystal SiGe layer. This dependency is also considered to be due to the decrease of the melting point with the increase of the concentration of Ge. For example, while the melting point of Si is about 1410° C., the melting point of the mixed crystal SiGe layer containing Ge in a concentration of 20% decreases to about 1300° C. It is therefore considered that the mixed crystal SiGe layer has lower heat resistance to the occurrence of dislocation than Si has.

As described above, the plastic deformation of the wafer depends on the temperature of activation annealing, the opening ratio, and the concentration of Ge. Accordingly, critical conditions may be determined based on these three parameters, and activation annealing may be performed under conditions not exceeding them.

Figure 4:
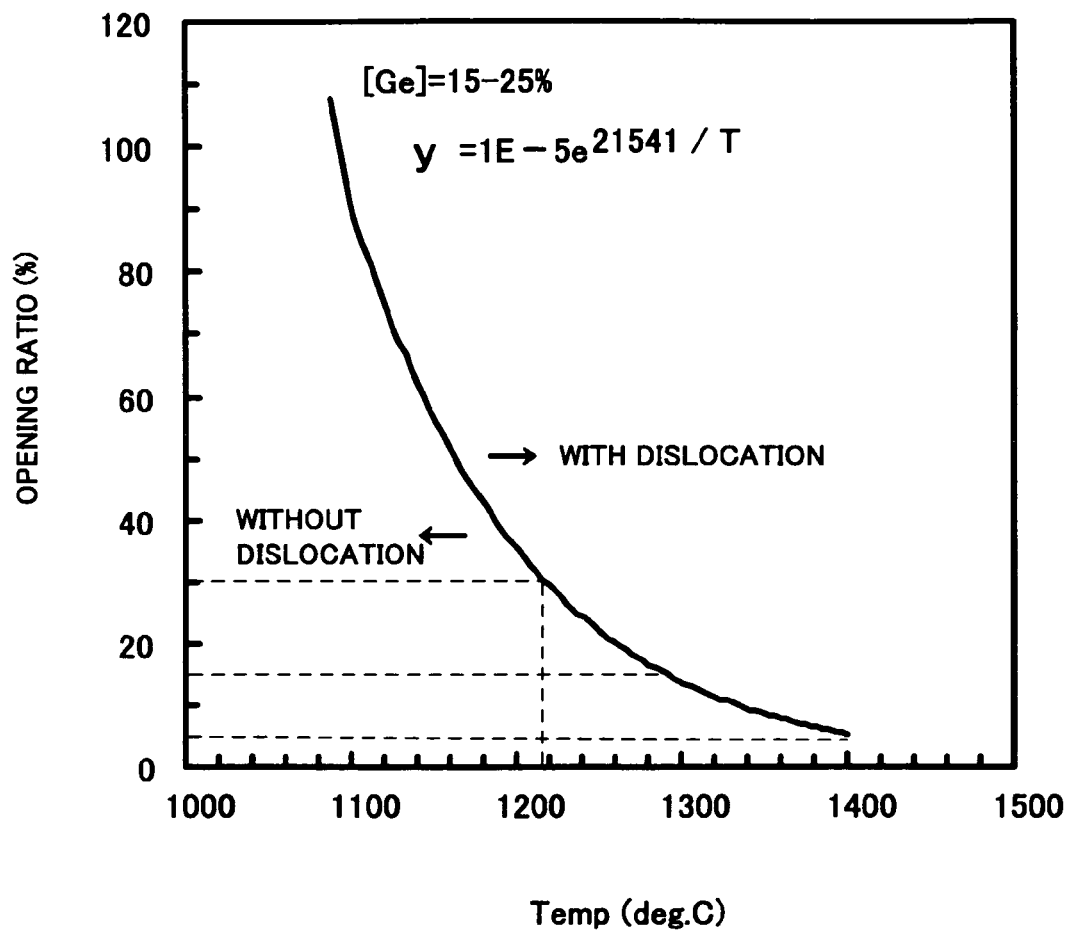
FIG. 4 is the relationship among the activation annealing temperature, the opening ratio, the concentration of Ge, and the critical conditions according to an embodiment of the invention.

For example, first, the allowance of surface dislocation density, which is a factor for inducing plastic deformation, is determined in advance from the allowable amount of plastic deformation. Subsequently, critical conditions depending on the above-described three parameters are determined to be settled within this allowance as shown in FIG. 4. Further, the critical activation annealing temperature (upper limit of the annealing temperature) is determined from the opening ratio and the addition amount of Ge that have already been determined.

For example, when the concentration of Ge in the mixed crystal SiGe layer is 15 to 25%, the relationship between the opening ratio y(%) and the activation annealing temperature T(k) only needs to satisfy $y \leq 1E-5 \exp(21541/T)$ However, in order to activate the impurity in a high concentration to decrease the parasitic resistance and increase the drain current, it is better that the activation annealing temperature be higher. Preferably, the temperature is 1150° C. or higher, and more preferably, 1200° C. or higher.

By determining the critical conditions in this way and performing activation annealing under conditions, such as at 1200° C., not exceeding the critical conditions, the impurity implantation layer 19 is activated in a high concentration, a source region 19a and a drain region 19b of p-MOSFETs are formed, and a region of the semiconductor substrate (Sub.) directly below the gate electrode 14a sandwiched by the mixed crystal SiGe layers will serve as a channel region.

Figure 1I:
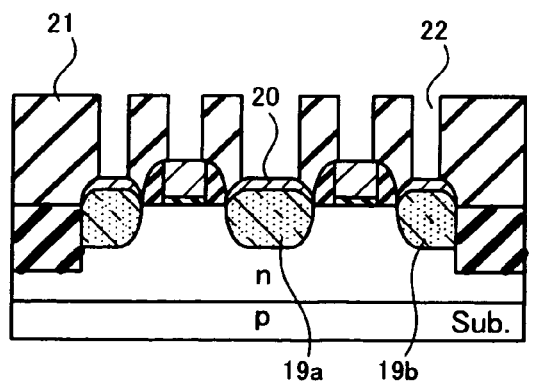

Further, in the opposite way, with the p-MOSFET region masked, an n-MOSFET region is formed. As shown in FIG. 1I, after, for example, a high melting point metal film made of nickel platinum (NiPt) is formed on the surface of the semiconductor substrate (Sub.), annealing is performed to silicide the surface side of the mixed crystal SiGe layer 18, thereby forming a silicide layer 20 made of nickel silicide. Subsequently, an interlayer insulating film 21 of, for example, $SiO_2$ is deposited on the surface of the semiconductor substrate (Sub.). Then, contact holes 22 are formed in the interlayer insulating film 21 on the gate electrode 14a and on the silicide layers 20 on the surfaces of the source region 19a and the drain region 19b (active layers).

Further, connection to the interconnection (not shown) is established through a via (not shown) formed in each contact hole 22, thus forming a semiconductor device.

In the present embodiment, the annealing temperature is determined to be equal to or lower than the critical condition for occurrence of the surface dislocation assuming that the opening ratio of the mixed crystal SiGe layer and the concentration of Ge in the mixed crystal SiGe layer are predetermined values. However, it is also possible to be determined the other parameters to be equal to or less than the critical conditions for occurrence of the surface dislocation assuming that the annealing temperature is a predetermined value.

The opening ratio is assumed to be a predetermined value (for example, 10%); however, the opening ratio needs to be 5 to 30%. If the opening ratio is less than 5%, control of the film thickness and the Ge concentration upon formation of the mixed crystal SiGe layer is not stable because of the dimensions and the difference between coarseness and fineness of the element region. This instability makes the epitaxial growth difficult and causes malfunction, such as a decrease in driving force and variations in characteristics, and reduction in yield. On the other hand, if the opening ratio is more than 30%, it becomes difficult to activate an impurity in a high concentration at an activation annealing temperature equal to or lower than the above-described critical condition for occurrence of the surface dislocation. In order to activate an impurity in a high concentration to obtain a sufficient margin in terms of heat resistance to plastic deformation and occurrence of dislocation, the opening ratio is preferably 15% or less. More preferably, the opening ratio is 10% or less.

The concentration of Ge is also assumed to be a predetermined value (for example, 25%); however, the concentration of Ge needs to be 1 to 25%. If the concentration of Ge is less than 1%, it becomes difficult to apply a compressive stress to the channel region. In order to apply an appropriate compressive stress in the transverse direction, the opening ratio is preferably 15% or more. On the other hand, if the opening ratio is more than 25%, the amount of distortion increases. This increase makes it difficult to epitaxially grow the mixed crystal SiGe layer without occurrence of a lattice defect, and also makes it difficult to activate an impurity in a high concentration at an activation anneal temperature equal to or lower than the above-described critical condition for occurrence of the surface dislocation to obtain a sufficient margin for heat resistance to plastic deformation and occurrence of dislocation.

In the present embodiment, the critical conditions for occurrence of the surface dislocation are determined, and conditions are set not to exceed the critical conditions. This enables introduction of the mixed crystal SiGe layer while suppressing occurrence of dislocation and crystal defects, thereby performing activation annealing at a heating/cooling rate of $10^{5°}$ C./sec or higher. Accordingly, an appropriate compressive stress in the transverse direction can be applied to the channel region without plastic deformation of the semiconductor substrate, and activation in a high concentration and shallow junction in the impurity implantation layer can be achieved.

In addition, the increase of junction leakage current due to generation of defects that act as carrier generators can be suppressed to decrease the parasitic resistance and improve the mobility of carriers that move in the channel region. This enables formation of a high-performance semiconductor device that has a high driving force. Furthermore, it becomes possible to suppress decreases in pattern formation accuracy in later processes, such as dimensional deviation and misalignments in a lithography process, which are due to plastic deformation, enabling achievement of stable processes and improvement in production yield.

Second Embodiment

In the present embodiment, a semiconductor device is formed in a similar manner to the first embodiment. However, the present embodiment differs from the first embodiment in that limitations are imposed on implantation conditions of impurity ions to be introduced into an epitaxially grown mixed crystal SiGe layer, and that the opening ratio is set to 25%.

Using the same manufacturing processes as those in the first embodiment, in an impurity ion implantation process as shown in FIG. 1G, impurity ions are implanted by an ion implantation method with the offset insulating film 15a and the gate side wall 16a used as masks, in the same manner as in the first embodiment. At this point, however, implantation conditions are controlled. For example, the impurity implantation layer 19 is formed in the mixed crystal SiGe layer 18 by doping B as a p-type impurity under conditions where the acceleration energy is 1 keV, and the dosage is 3E15 cm$^{-2}$.

Then, in the same manner as the first embodiment, after this is annealed, for example, at 1050° C. by spike RTA using a halogen lamp, activation annealing is performed by using a flash lamp at a heating/cooling rate of $10^{5°}$ C./sec or higher at 1200° C.

Figure 5A:
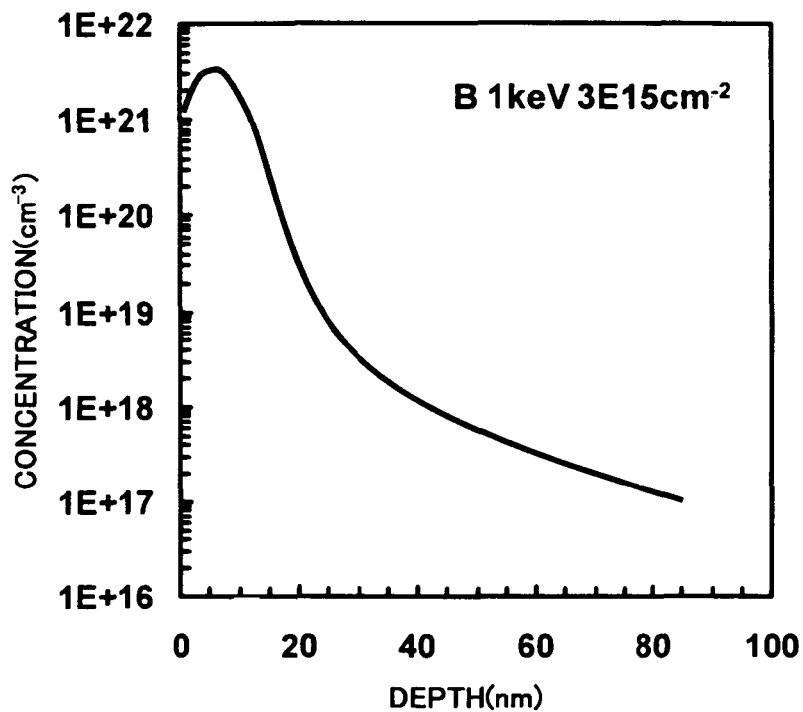
FIG. 5A is a profile of the impurity concentration in the depth direction according to an embodiment of the invention.
Figure 5B:
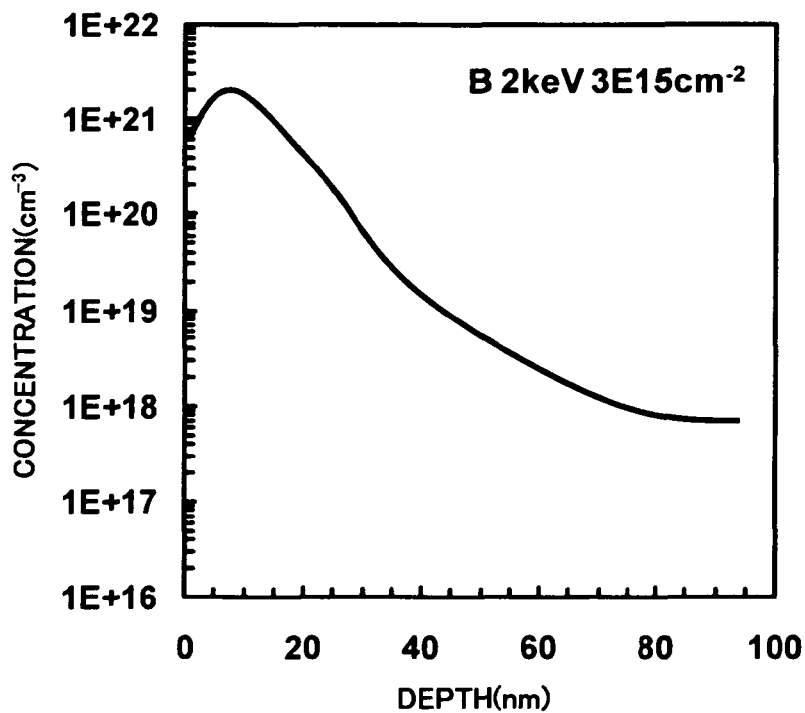
FIG. 5B is a profile of the impurity concentration in the depth direction in a comparative example.

FIG. 5A shows a profile of the impurity concentration in the depth direction at this point. FIG. 5B shows a comparative example in which boron (B) is doped under conditions where the acceleration energy is 2 keV and the dosage is 3E15 cm$^{-2}$. In the profile of the present embodiment, the concentration at a depth of 80 nm as a Si/SiGe interface, is 1E18 cm$^{-3}$ or less In contrast, in the profile of the comparative example, the concentration is over 1E18 cm$^{-3}$.

Figure 6:
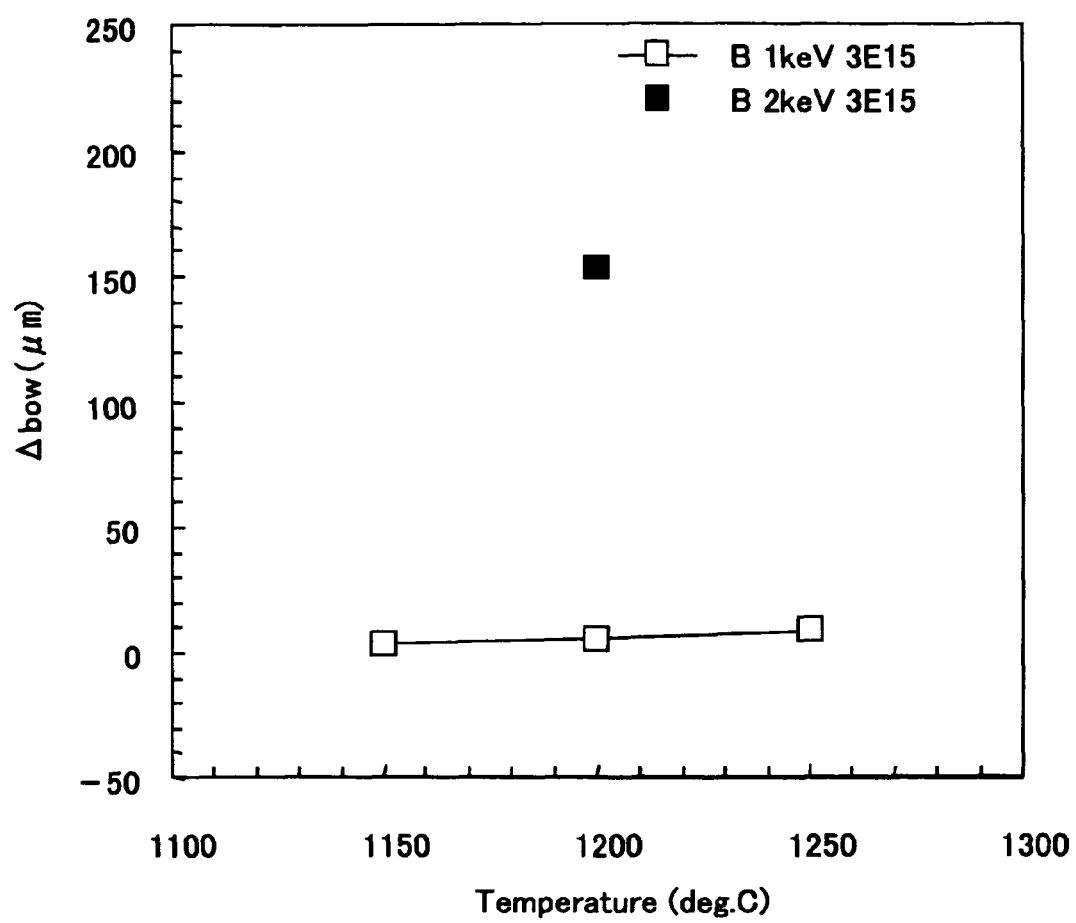
FIG. 6 is plastic deformation amounts after activation annealing according to an embodiment of the invention.

FIG. 6 shows the plastic deformation amount (ΔBow) after activation annealing. FIG. 6 also shows the amount in the above-mentioned comparative example (implantation conditions: 2 keV, 3E15 cm$^{-2}$) and the amounts when only the activation annealing temperature is varied to 1150° C. and to 1250° C. As shown in the figure, it is found that the plastic deformation amount is suppressed to be small and is not dependent on the activation annealing temperature in the present embodiment. On the other hand, large plastic deformation is found in the comparative example.

Based on these findings, plastic deformation of the wafer can be regarded not as a phenomenon depending only on the amount of volume of SiGe but as a phenomenon depending on the condition (depth of doping) of ion implantation into the mixed crystal SiGe layer. That is, it is suggested that, without imposing limitations on the opening ratio of SiGe, limiting the condition (depth of doping) of ion implantation introduced into the mixed crystal SiGe layer enables prevention of dislocation and crystal defects occurring around the mixed crystal SiGe layer, so that plastic deformation of the wafer can be suppressed while the stress due to SiGe effectively remains.

Figure 7A:
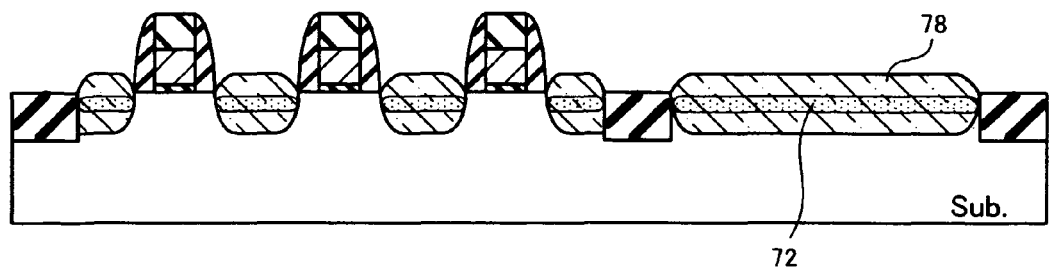
FIG. 7A is a sectional view showing a dislocation occurrence state after ion implantation into a mixed crystal SiGe layer according to an embodiment of the invention.
Figure 7B:
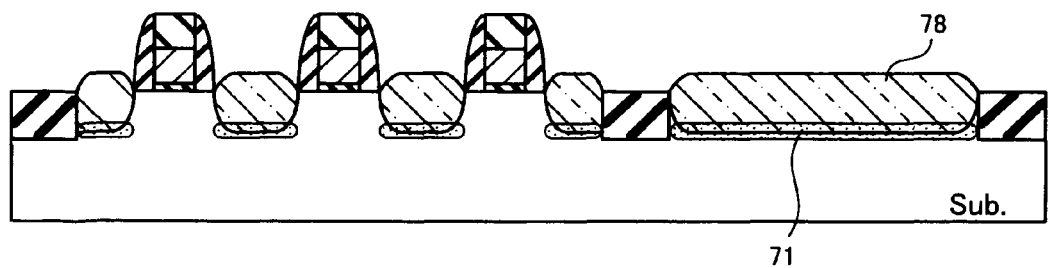
FIG. 7B is a sectional view showing a dislocation occurrence state after ion implantation into a mixed crystal SiGe layer in a comparative example.

FIG. 7A is a manufacturing process sectional view showing a dislocation occurrence after ion implantation into the mixed crystal SiGe layer in the present embodiment (implantation conditions: 1 keV, 3E15 cm$^{-2}$), and FIG. 7B is a manufacturing process sectional view showing the occurrence in the above-mentioned comparative example (implantation conditions: 2 keV, 3E15 cm$^{-2}$).

In the comparative example, an impurity implantation layer having a thickness exceeding that of the mixed crystal SiGe layer is formed. In such a case, interstitial atoms are anticipated to be discharged to a SiGe/Si interface. If the number of interstitial atoms increases, a crystal defect 71 (discontinuity of crystal) serving as a nucleus of dislocation is formed at the SiGe/Si interface, and therefore crystal recovery in the subsequent annealing process is impeded. The stress amount originally applied to the mixed crystal SiGe layer cannot therefore be maintained, resulting in plastic deformation of the wafer. Even if crystal recovery is achieved, dislocation extends from the SiGe/Si interface to the surface of the Si substrate due to the thermal stress in the annealing process. This relaxes the SiGe stress, resulting in plastic deformation of the wafer.

On the other hand, in the present embodiment, an impurity implantation layer is formed so as not to exceed the thickness (SiGe/Si interface) of a mixed crystal SiGe layer. A crystal defect 72 serving as a nucleus of dislocation remains in a mixed crystal SiGe layer 78. Accordingly, since no crystal defect exists at the SiGe/Si interface, plastic deformation of the wafer due to extension of dislocation is suppressed even through the annealing process.

Further, through the same processes as in the first embodiment, a semiconductor device is formed.

In the present embodiment, the impurity concentration at the Si/SiGe interface is 1E18 cm$^{-3}$ or less. This enables introduction of the mixed crystal SiGe layer and activation annealing at a heating/cooling rate of $10^{5°}$ C./sec or higher, while suppressing occurrence of dislocation and crystal defects. Accordingly, the same effects as those in the first embodiment can be obtained.

Third Embodiment

In the present embodiment, a semiconductor device is formed in a similar manner as the first embodiment. However, the present embodiment differs from the first embodiment in that limitations are imposed on implantation conditions of impurity ions to be introduced into a mixed crystal SiGe layer formed in a non-element region, which is a region other than an element region in which active elements are formed.

In the above-described semiconductor manufacturing processes, if the opening ratio of SiGe is small in epitaxial growth of a mixed crystal SiGe layer on the surface of the recess region, there is a problem that the SiGe film formation rate and the Ge concentration are not stable, and the film quality and characteristics vary depending on the dimensions and the difference between coarseness and fineness of the element region. Therefore, in order to suppress variations in wafers and in products, the opening ratio of SiGe needs to be increased to some extent and fixed. To address this need, an approach of forming a dummy mixed crystal SiGe layer (dummy pattern) in a non-element region is used similarly to the typical approach of providing a dummy pattern in a non-element region for the purpose of preventing dishing due to CMP.

Figure 8A:
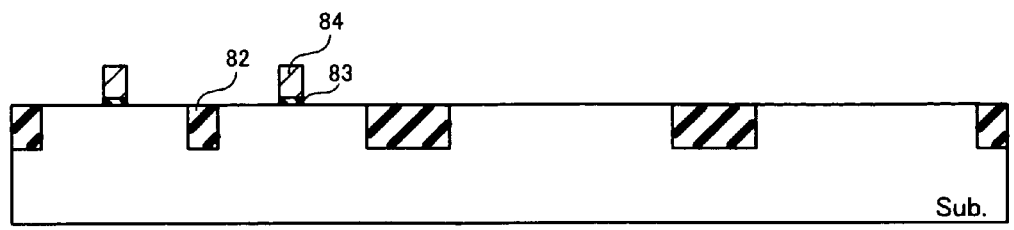
FIGS. 8A to 8F are sectional views showing semiconductor manufacturing processes according to an embodiment of the invention.

Referring to semiconductor manufacturing process sectional views shown in FIGS. 8A to 8F, manufacturing processes of a semiconductor device in the present embodiment including formation of a dummy pattern are described below. As shown in FIG. 8A, in the same manner as in the first embodiment, an element isolation region 82 is formed, and a gate electrode 84, a gate insulating film 83 and the like are formed on a semiconductor substrate (Sub.) into which a predetermined impurity has been implanted.

Figure 8B:
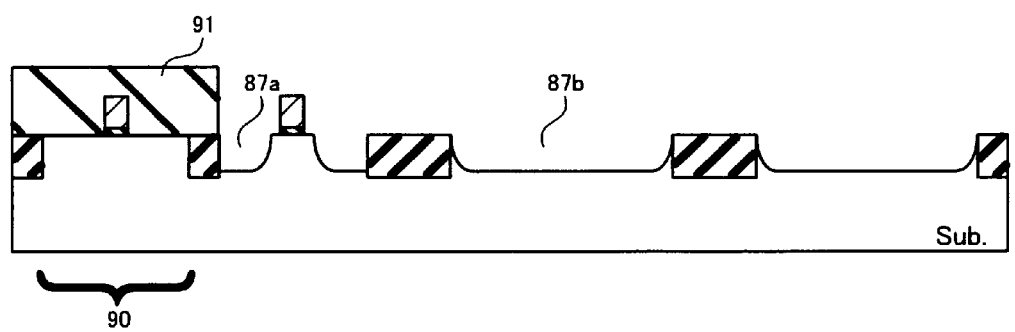

Then, as shown in FIG. 8B, in the same manner as in the first embodiment, masking an n-MOSFET region 90, for example, with a photoresist film 91, using the gate electrode 84 and the like as masks in the element region and also using the element isolation region 82 as a mask in the non-element region, openings (recess regions) 87a and 87b for forming a mixed crystal SiGe layer are formed by RIE. In the non-element region, the opening 87b having a larger area is formed.

Figure 8C:
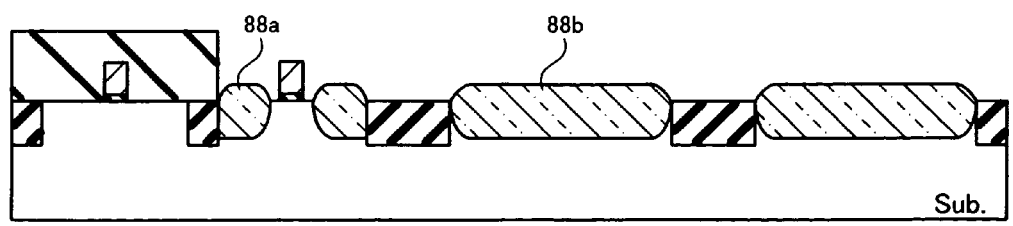

Subsequently, as shown in FIG. 8C, in the same manner as in the first embodiment, mixed crystal SiGe layers 88a and 88b made up of Si and Ge, which has a larger lattice constant than Si has, are epitaxially grown in the opening 87 in order to apply a compressive stress to a channel region. In the non-element region, the mixed crystal SiGe layer (dummy pattern) 88b having a larger area is formed.

Figure 8D:
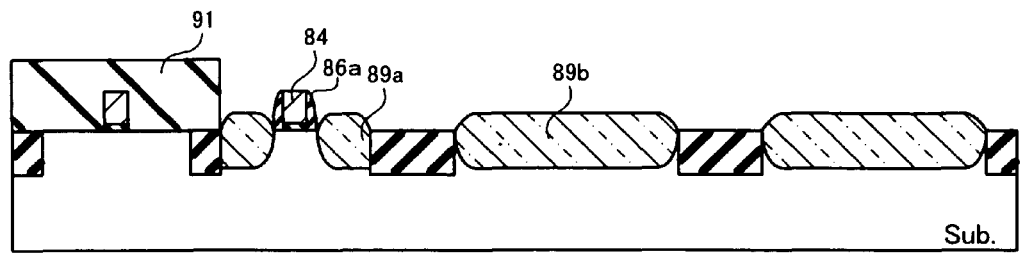

As shown in FIG. 8D, after a Si oxide film and a Si nitride film are formed by a CVD method or the like, they are etched back by RIE, so that a gate side wall 86a of a multilayered structure having a thickness of, for example, 20 nm is formed on the gate electrode 84.

Figure 8E:
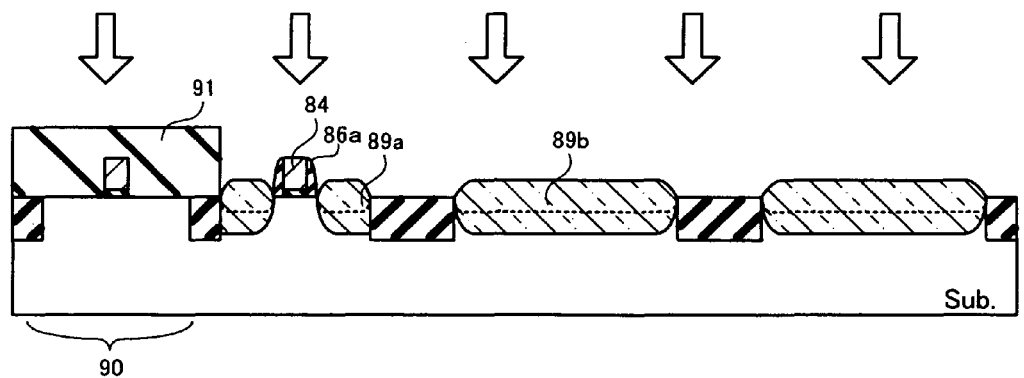

Then, as shown in FIG. 8E, masking the n-MOSFET region 90, for example, with the photoresist film 91, and with the gate electrode 84 and the like and using the gate side wall 86a as a mask, boron (B), for example, is doped as a p-type impurity at an acceleration energy of 0.2 KeV at a dosage of 1E15 $cm^{-2}$ by an ion implantation method, so that shallow impurity implantation layers 89a and 89b are formed in the mixed crystal SiGe layers 88a and 88b.

Figure 8F:
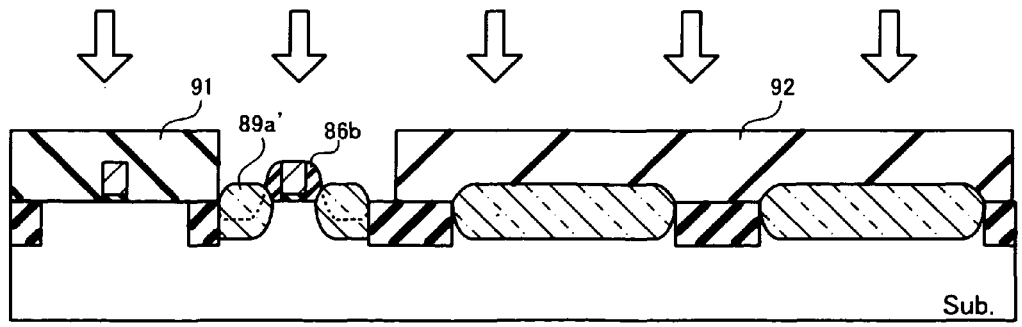

Subsequently, the gate side wall 86a is once removed by a chemical, and as shown in FIG. 8F, in the same manner as the gate side wall 86a, a gate side wall 86b of a multilayered structure having a thickness of, for example, 30 nm is formed on the side of the gate electrode 84. Further, masking the mixed crystal SiGe layer (dummy pattern) 88b, for example, with a photoresist film 92, and using the gate electrode 84 and the like and the gate side wall 86b as masks, boron (B) for example, is doped asap-type impurity at an acceleration energy of 5 KeV at a dosage of 3E15 $cm^{-2}$ by an ion implantation method, so that a deep impurity implantation layer 89a' is formed in the mixed crystal SiGe layer 88a that is apart from an end of the gate electrode 84.

Further, in the same manner as in the first embodiment, spike RTA and activation annealing using a flash lamp are performed. At this point, the impurity concentration at the Si/SiGe interface in the mixed crystal SiGe layer (dummy pattern) 88b is 1E18 $cm^{-3}$ or less.

Further, through the same processes as those in the first embodiment, a semiconductor device is formed.

In the present embodiment, by masking a dummy pattern, which has a great influence due to its large area on plastic deformation, in deep implantation of an impurity, the impurity concentration at the Si/SiGe interface in the dummy pattern is 1E18 $cm^{-3}$ or less. The impurity concentration equal to or less than 1E18 $cm^{-3}$ at the Si/SiGe interface in the dummy pattern allows plastic deformation to be suppressed. However, to ensure a process window in later processes more sufficiently, it is preferable that the impurity concentration be more controlled.

Figure 9:
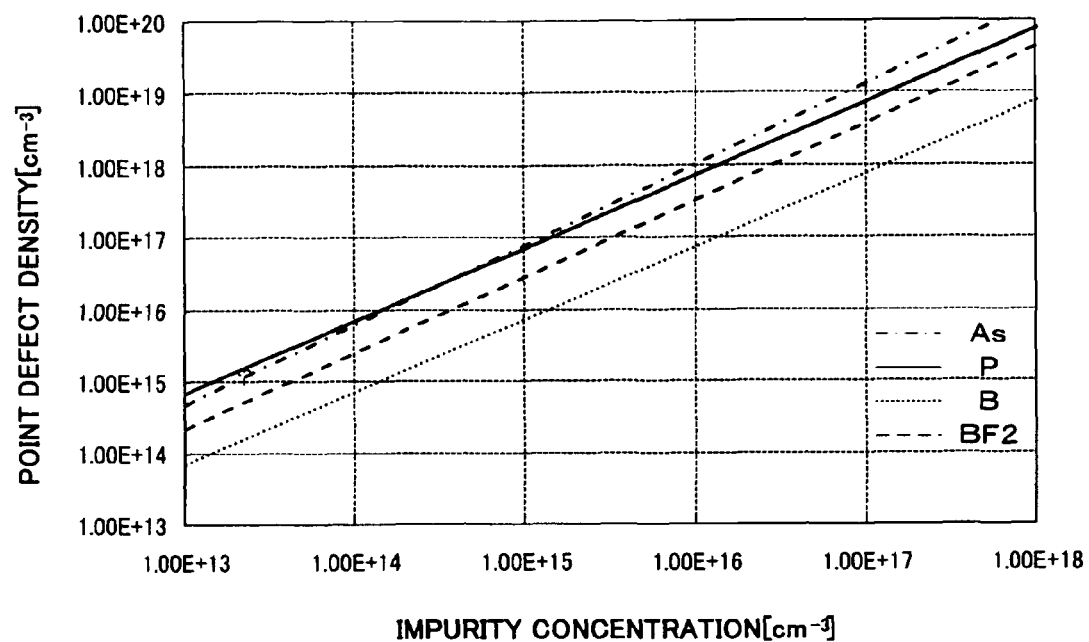
FIG. 9 is the relationship between the impurity concentration and the point defect density at a Si/SiGe interface of a dummy pattern according to an embodiment of the invention.
Figures 10, 11:
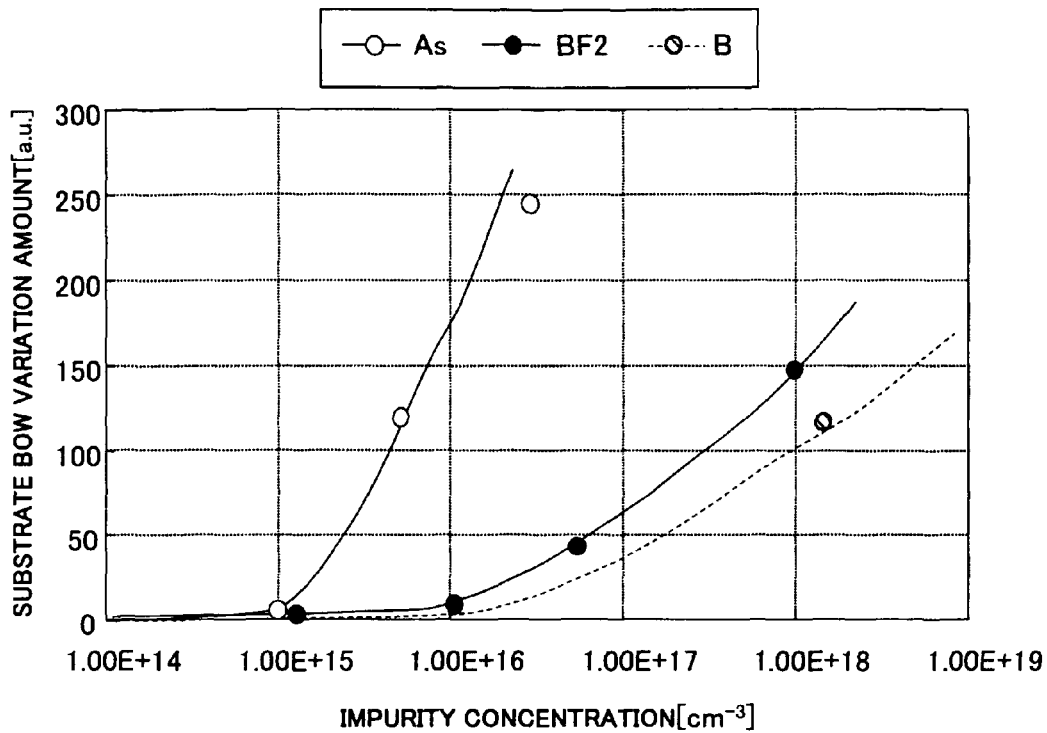
FIG. 10 is the relationship between the point defect density and the plastic deformation amount at the Si/SiGe interface of the dummy pattern according to an embodiment of the invention.
FIG. 11 is a table showing more preferable upper limits of the impurity concentration at the Si/SiGe interface in the dummy pattern.

Specifically, the point defect density that is correlated with the impurity concentration at the Si/SiGe interface of a dummy pattern, as shown in FIG. 9, greatly affects the plastic deformation amount (substrate bow variation amount) as shown in FIG. 10. The plastic deformation amount varies for each implanted ionic species. For example, regarding arsenic (As) having a large atomic weight, its plastic deformation amount is large with respect to the concentration (point defect density). Regarding boron (B) having a small atomic weight, its plastic deformation amount is suppressed with respect to the concentration (point defect density).

Accordingly, a more preferable upper limit of the impurity concentration at the Si/SiGe interface in the dummy pattern is defined for each ionic species so that a large margin is secured for the concentration (about 1E16 $cm^{-3}$) from which a defect starts to occur. The de fined upper limits are as shown in FIG. 11.

In the present embodiment, limitation is imposed on the implantation conditions of impurity ions in the dummy pattern so that the impurity concentration at the Si/SiGe interface is 1E18 $cm^{-3}$ or less. This limitation enables introduction of the mixed crystal SiGe layer and activation annealing at a heating/cooling rate of $10^{5\circ}$ C./sec or higher, while suppressing occurrence of dislocation and crystal defects. Accordingly, the same effects as those in the first embodiment can be obtained. Furthermore, since a large margin is secured for each ionic species in the definition of the upper limit, a process window in later processes can be more sufficiently ensured.

In the present embodiment, limitation on implantation conditions of impurity ions is applied to the whole mixed crystal SiGe layer (dummy pattern) in the non-element region. However, it is effective for the limitation to be applied to a portion having a relatively large area. Specifically, for example, if limitation on implantation conditions of impurity ions is applied to a portion having an area of 10 $\mu m^2$ or more, which is produced using the 65 nm process, the plastic deformation amount can be effectively suppressed. Preferably, limitation on implantation conditions of impurity ions is applied to a portion having an area of 1 $\mu m^2$ or more. This enables the plastic deformation amount to be further suppressed.

Fourth Embodiment

In the present embodiment, a semiconductor device is formed in a similar manner to the third embodiment. However, the present embodiment differs from the third embodiment in that impurity ions are not implanted by providing a mask on the mixed crystal SiGe layer formed in the non-element region, which is a region other than an element region in which active elements are formed.

Figure 12:
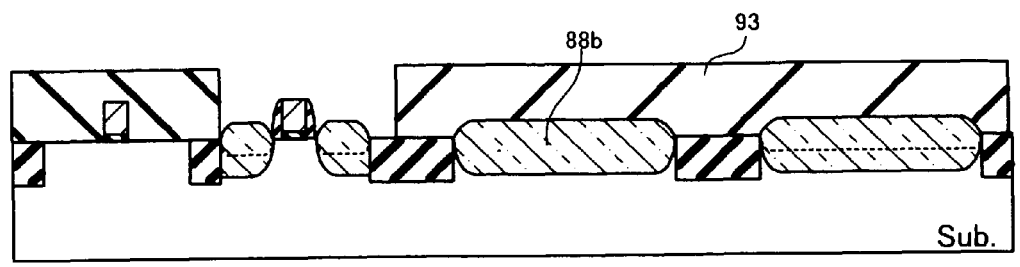
FIG. 12 is a sectional view showing a semiconductor manufacturing process according to an embodiment of the invention.

That is, as shown in FIG. 12, when the shallow impurity implantation layer 89a is formed, not only the n-MOSFET region 90 but also the mixed crystal SiGe layer (dummy pattern) 88b are masked, for example, with the photoresist film 93. This prevents impurity ions from being implanted into the mixed crystal SiGe layer (dummy pattern) 88b.

Further, in the same manner as in the first embodiment, spike RTA (1050° C.) and activation annealing (1200° C.) using a flash lamp are performed, and a semiconductor device is formed through the same processes as in the first embodiment.

Figure 13:
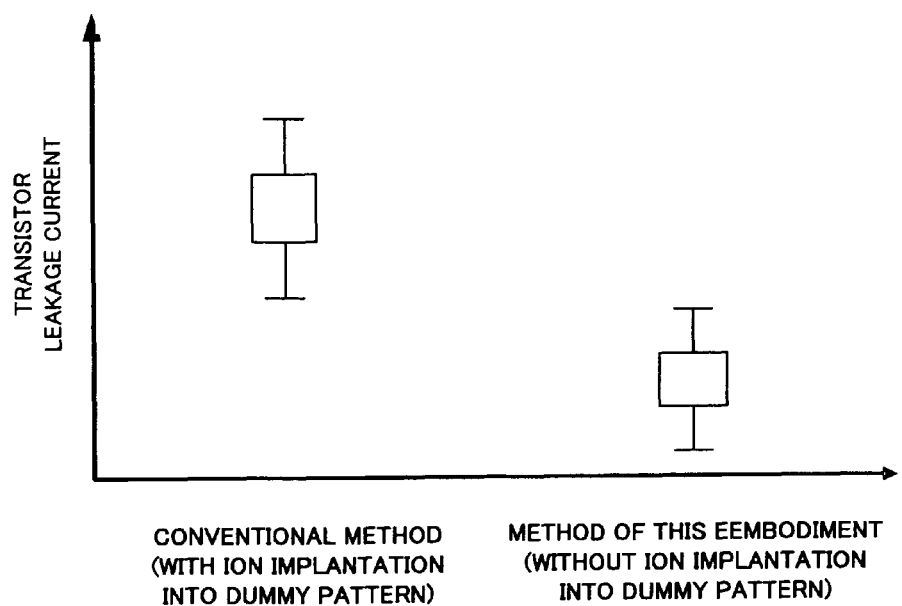
FIG. 13 is results of measuring transistor leakage current according to an embodiment of the invention.

In the semiconductor device formed in this way, transistor leakage current is measured. The measured results are shown in FIG. 13, in comparison with results of the conventional semiconductor device where impurity ions are implanted into a dummy pattern. As shown in the figure, it is found that transistor leakage current is further suppressed in the semiconductor device of the present embodiment than in the conventional semiconductor device.

In the present embodiment, a mask is provided on the dummy pattern to prevent implantation of impurity ions. This suppresses occurrence of dislocation and crystal defects, and therefore enables the introduction of the mixed crystal SiGe layer and activation annealing at a heating/cooling rate of $10^{5\circ}$ C./sec or higher. Accordingly, the same effects as those in the first embodiment can be obtained. Further, since the implantation of impurity ions in the dummy pattern is not performed, a process window in later processes can thus be more sufficiently ensured.

In the present embodiment, implantation conditions of impurity ions are limited in the whole mixed crystal SiGe layer (dummy pattern) in the non-element region. However, it is effective for the limitation to be applied to a port ion having a relatively large area. Specifically, for example, if a mask is provided to a portion having an area of 10 $\mu m^2$ or more, which is produced using the 65 nm process, to prevent implantation of impurity ions, the plastic deformation amount can be more effectively suppressed. Preferably, prevention of impurity ion implantation ions for a portion having an area of 1 μm² or more enables the plastic deformation amount to be further suppressed.

Fifth Embodiment

In the present embodiment, a semiconductor device is formed in a similar manner to the third embodiment. However, the present embodiment differs from the third embodiment in that the area of an implantation region of impurity ions, which are introduced into a mixed crystal SiGe layer formed in a non-element region other than an element region in which active elements are to be formed, is smaller than the opening area of the mixed crystal SiGe layer, and in that the opening ratio is 20%. That is, a mask in the non-element region in implantation of impurity ions differs from that in the fourth embodiment.

Figure 14:
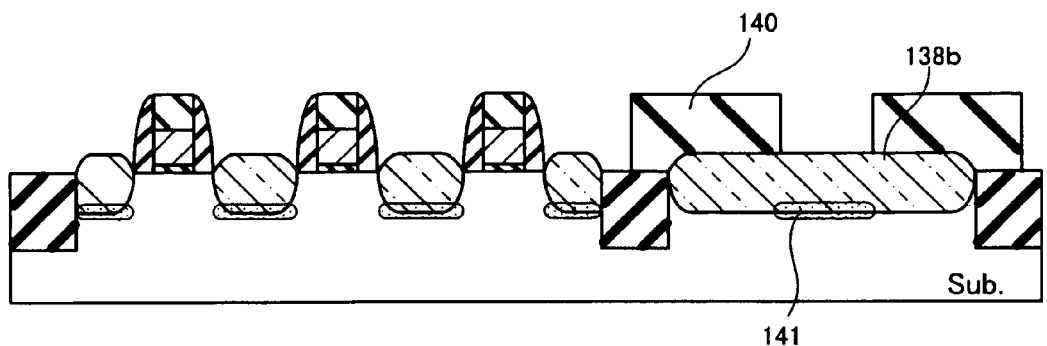
FIG. 14 is a sectional view showing a semiconductor manufacturing process according to an embodiment of the invention.

As shown in FIG. 14, when the impurity implantation layer 139 is formed after formation of the mixed crystal SiGe layer 138a, not only the n-MOSFET region but also part of the mixed crystal SiGe layer (dummy pattern) 138b are masked, for example, with the photoresist film 140. This results in the area of implantation region of impurity ions in the mixed crystal SiGe layer (dummy pattern) 138b being smaller than the opening area of the mixed crystal SiGe layer (dummy pattern) 138b, and reducing a crystal defect 141 serving as a nucleus of dislocation. Accordingly, similarly to the second embodiment, extension of dislocation from the SiGe/Si interface to the substrate surface due to the thermal stress can be suppressed to reduce plastic deformation.

Figure 15:
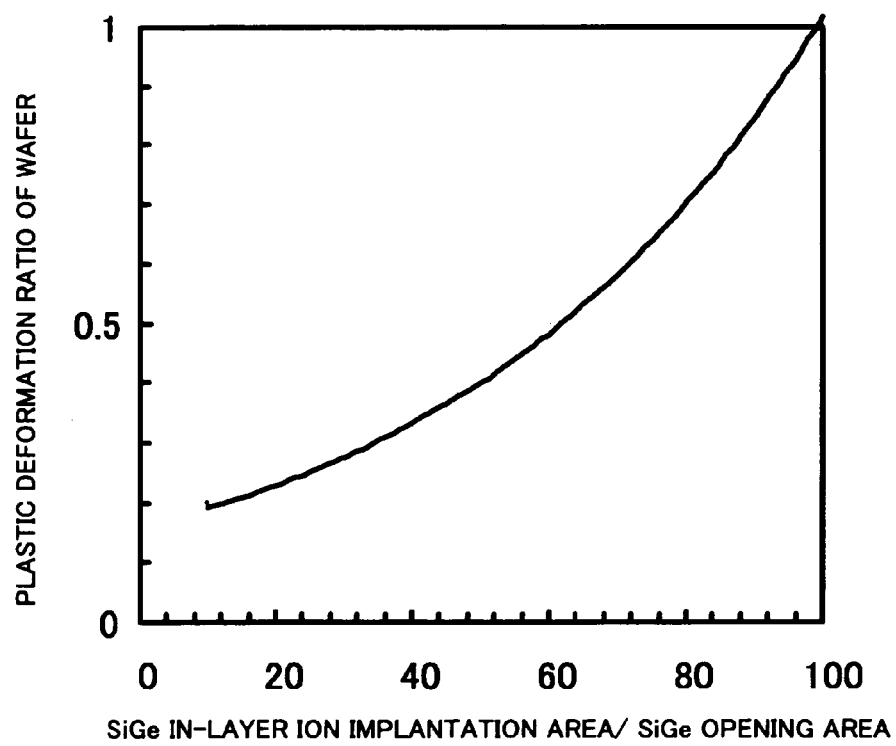
FIG. 15 shows the relationship between the plastic deformation amount and the area of an impurity ion implantation region relative to an opening area of a mixed crystal SiGe layer according to an embodiment of the invention.

Then, in the same manner as in the first embodiment, spike RTA (1050° C.) and activation annealing (1200° C.) using a flash lamp are performed. The relationship between the plastic deformation amount of the wafer (relative value) and the area of the implantation region of impurity ions relative to the opening area of the mixed crystal SiGe layer at this point is shown in FIG. 15. As shown in the figure, it is found that the plastic deformation amount of the wafer depends on the area ratio, and the area ratio increases as the plastic deformation amount of the wafer increases. Therefore, the smaller the area ratio is, the more plastic deformation amount can be suppressed. However, formation of an activation layer in the element region is indispensable, and the lower limit value is determined based on this. Accordingly, it is preferable that the ion implantation area ratio in the non-element region having the mixed crystal layer be made smaller.

Further, through the same processes as in the first embodiment, a semiconductor device is formed.

In the present embodiment, the area of the implantation region of impurity ions is smaller than the opening area of the mixed crystal SiGe layer in the dummy pattern. This enables introduction of the mixed crystal SiGe layer and activation annealing at a heating/cooling rate of $10^{5°}$ C./sec or higher, while suppressing occurrence of dislocation and crystal defects in the dummy pattern. Accordingly, the same effects as those in the first embodiment can be obtained.

In the present embodiment, limitation on the implantation condition of impurity ions is applied to the whole mixed crystal SiGe layer (dummy pattern) in the non-element region. However, it is effective for the limitation to be applied to a portion having a relatively large area. Specifically, for example, if limitation on the implantation area of impurity ions is applied to a portion having an area of 10 μm² or more, which is produced using the 65 nm process, the plastic deformation amount can be effectively suppressed. Preferably, limitation on the implantation area of impurity ions is applied to a portion having an area of 1 μm² or more. This enables the plastic deformation amount to be further suppressed.

Sixth Embodiment

In the present embodiment, a semiconductor device is formed in a similar manner to the third embodiment. However, the present embodiment differs from the third embodiment in that an element isolation region is introduced into a mixed crystal SiGe layer (dummy pattern), which is formed in a non-element region other than an element region in which active elements are to be formed, to make the area of the mixed crystal SiGe layer (dummy pattern) smaller.

Figure 16:
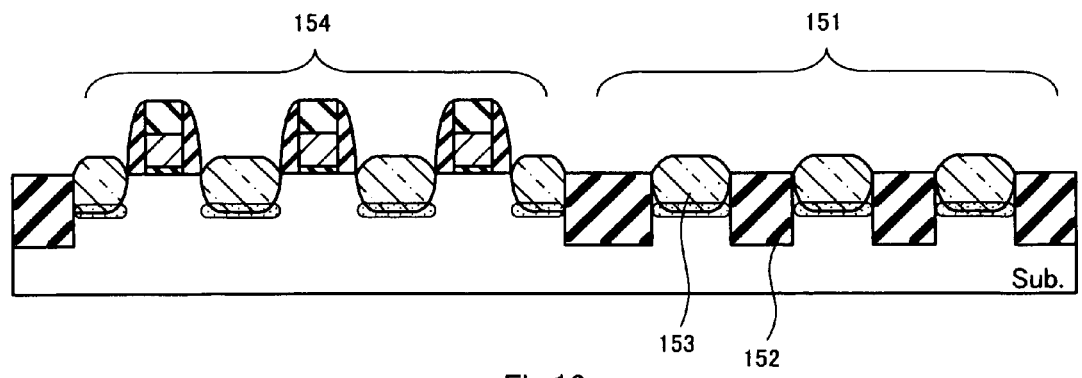
FIG. 16 is a sectional view showing a semiconductor manufacturing process according to an embodiment of the invention.

As shown in FIG. 16, an element isolation region 152 of an STI structure is formed in a non-element region 151 to make the area of a mixed crystal SiGe layer (dummy pattern) 153 smaller. Such an element isolation region 152 can be formed simultaneously with formation of an element isolation region of an STI structure in an element region 154, for example.

Further, through the same processes as in the first embodiment, a semiconductor device is formed.

In the dummy pattern, the area of the mixed crystal SiGe layer is made smaller. This enables introduction of the mixed crystal SiGe layer and activation annealing at a heating/cooling rate of $10^{5°}$ C./sec or higher, while suppressing occurrence of dislocation and crystal defects in the dummy pattern. Accordingly, the same effects as those in the first embodiment can be obtained.

In particular, when the thickness of the mixed crystal SiGe layer is 100 nm, for example, dislocation occurs in the mixed crystal SiGe layer (dummy pattern) having a size of 10 μm² or more. However, when the element isolation region 152 is formed such that the size of the mixed crystal SiGe layer (dummy pattern) 153 is set to 5 μm² or less to achieve a small area, the plastic deformation amount can be effectively suppressed. Preferably, limitation on the implantation conditions of impurity ions is applied to a portion having an area of 1 μm² or more. This enables the plastic deformation amount to be further suppressed.

Figure 17A:
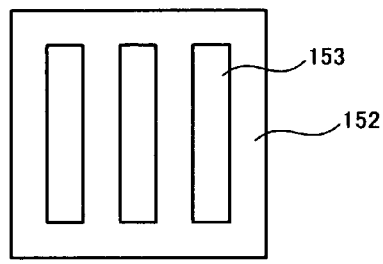
FIGS. 17A to 17C are top plan views of dummy patterns in a semiconductor manufacturing process according to an embodiment of the invention.
Figure 17B:
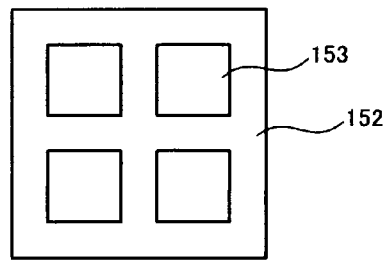
Figure 17C:
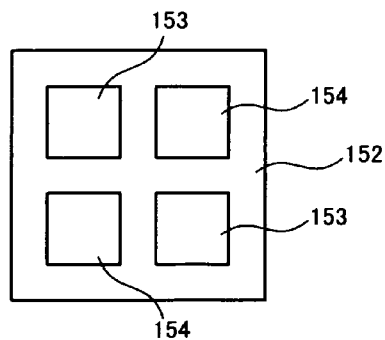

At least one element isolation region 152 as described above may be formed in the non-element region 151 to divide the mixed crystal SiGe layer (dummy pattern) 153, and the shape, the number of divisions, arrangement and so on of the element isolation region 152 are not particularly limited. For example, the mixed crystal SiGe layer (dummy pattern) 153 in the non-element region may be divided into stripe-shaped three parts, as shown in the top plan view of FIG. 17A. The mixed crystal SiGe layer (dummy pattern) 153 in the non-element region also may be divided into island-shaped four parts, as shown in the top view of FIG. 17B. The element region 154 and the mixed crystal SiGe layer (dummy pattern) 153 in the non-element region may also be arranged in a hounds tooth check pattern, as shown in the top view of FIG. 17C.

Seventh Embodiment

In the present embodiment, a semiconductor device is formed in a similar manner to the third embodiment. However, the present embodiment differs from the third embodiment in that a dummy gate made up of a dummy electrode, a side wall (spacer) and so on is introduced into a mixed crystal SiGe layer (dummy pattern) which is formed in a non-element region other than an element region in which active elements are to be formed, to make the area of the mixed crystal SiGe layer (dummy pattern) smaller. That is, the dummy gate is introduced instead of the element isolation region in the sixth embodiment.

Figure 18:
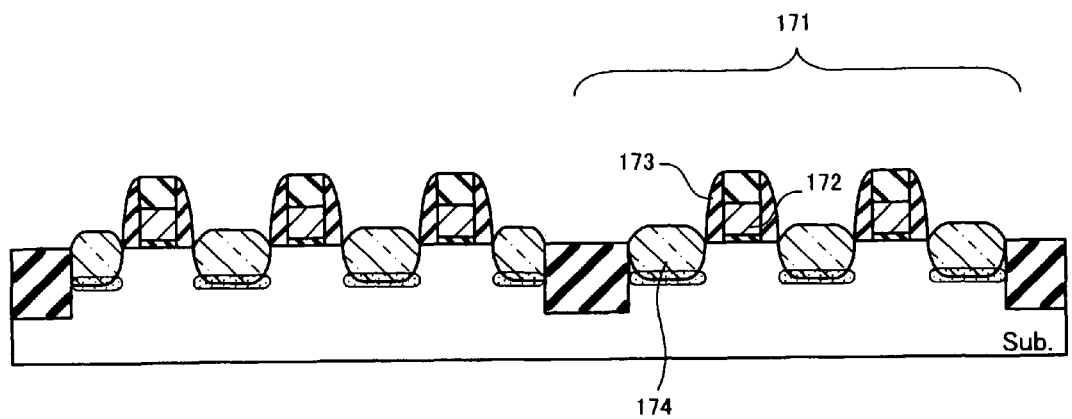
FIG. 18 is a sectional view showing a semiconductor manufacturing process according to an embodiment of the invention.

As shown in FIG. 18, in a non-element region 171, a dummy poly-Si electrode 172 and a side wall 173, for example, are formed, and a mixed crystal SiGe layer (dummy pattern) 174 is formed therebetween, so that the mixed crystal SiGe layer (dummy pattern) 174 has a smaller area. The dummy poly-Si electrode 172, the side wall 173 and the mixed crystal SiGe layer (dummy pattern) 174 as mentioned above can be formed simultaneously, just as in the element region.

Further, through the same processes as in the first embodiment, a semiconductor device is formed.

In the dummy pattern, the area of the mixed crystal SiGe layer is made smaller. This enables introduction of the mixed crystal SiGe layer and activation annealing at a heating/cooling rate of $10^{5°}$ C./sec or higher, while suppressing occurrence of dislocation and crystal defects in the dummy pattern. Accordingly, the same effects as those in the first embodiment can be obtained.

In the sixth and seventh embodiments, particularly, when the thickness of the mixed crystal SiGe layer is 100 nm, for example, dislocation occurs in the mixed crystal SiGe layer (dummy pattern) having a size of 10 $\mu m^2$ or more. However, when the dummy poly-Si electrode 172 and the side wall 173 are formed such that the size of the mixed crystal SiGe layer (dummy pattern) 153 is reduced to 5 $\mu m^2$ or less to achieve a smaller area, the plastic deformation amount can be effectively suppressed. Preferably, limitation on the implantation conditions of impurity ions is applied to a portion having an area of 1 $\mu m^2$ or more. This enables the plastic deformation amount to be further suppressed.

Eighth Embodiment

In the present embodiment, a semiconductor device is formed in a similar manner to the second embodiment. However, the present embodiment differs from the second embodiment in the order of spike RTA and activation annealing using a flash lamp in an annealing process after implantation of impurity ions introduced into a mixed crystal SiGe layer that has been epitaxially grown.

Through the same manufacturing processes as in the second embodiment, an impurity implantation layer is formed in the mixed crystal SiGe layer. Then, activation annealing is first performed by using a flash lamp at a heating/cooling rate of $10^{5°}$ C./sec or higher at 1200° C. Subsequently, annealing by spike RTA using a halogen lamp is performed, for example, at 1050° C.

Figure 19:
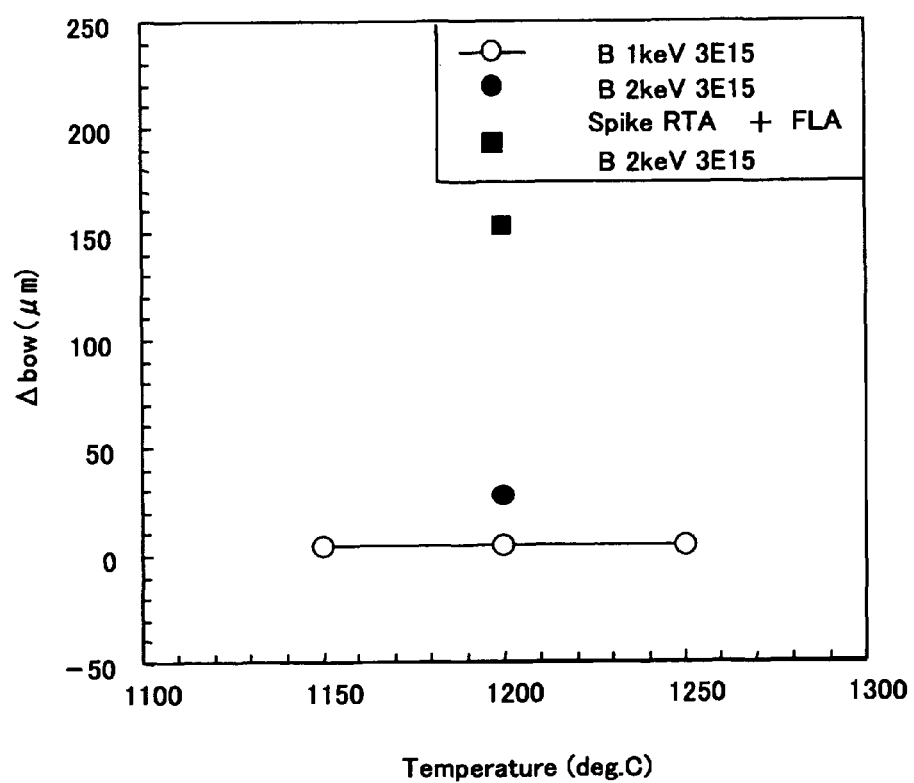
FIG. 19 is the plastic deformation amount after spike RTA according to an embodiment of the invention.

FIG. 19 shows the plastic deformation amount (ΔBow) after spike RTA. Implantation conditions are a p-type impurity of B, the acceleration energy of 1 keV and 2 keV, and the dosage of 3E15 $cm^{-2}$. In the case where the acceleration energy is 1 keV, only the activation annealing temperature is varied to 1150° C. and 1250° C. A comparative example where, under implantation conditions of 2 keV and 3E15 $cm^{-2}$, activation annealing is performed after spike RTA is additionally shown.

As shown in the figure, it is found that the plastic deformation amount is suppressed to a small amount and is not dependent on the activation annealing temperature in the present embodiment. It is also found that even if the acceleration energy increases, the plastic deformation amount does not change greatly.

From these findings, plastic deformation of the wafer can be regarded not as a phenomenon depending only on the amount of volume of SiGe but as a phenomenon depending also on the subsequent thermal budget. That is, it is suggested that, without imposing limitations on the opening ratio of SiGe and ion implantation conditions, controlling the thermal budget enables prevention of dislocation and crystal defects occurring around the mixed crystal SiGe layer, and thus plastic deformation of the wafer can be suppressed while the stress due to SiGe effectively remains.

Controlling the thermal budget in the present embodiment as used herein means that, after ions are implanted into the mixed crystal SiGe layer, activation annealing at a heating/cooling rate of $10^{5°}$ C./sec or higher is performed before a crystal defect caused by implantation is recovered, and activation annealing at a heating/cooling rate of $10^{5°}$ C./sec or higher is not performed after the crystal defect is recovered by spike RTA or the like.

Immediately after ion implantation into the mixed crystal SiGe layer, crystal is disordered in the mixed crystal SiGe layer. Thus, even when annealing at a heating/cooling rate of $10^{5°}$ C./sec or higher is performed, an area exposed to high temperature is confined to the outermost surface layer because of the short annealing time. Accordingly, crystal recovery at the bottom of the mixed crystal SiGe layer remains insufficient and it is considered that the growth of micro dislocation existing at the SiGe/Si interface is inhibited. The subsequent crystal recovery annealing by spike RTA eliminates the remaining defect at the bottom of the mixed crystal SiGe layer, and also suppresses the increase in heat stress. Therefore, it is considered that there is no growth of micro dislocation and, simultaneously, plastic deformation of the wafer is suppressed.

Further, through the same processes as in the first embodiment, a semiconductor device is formed.

In the present embodiment, controlling the thermal budget enables introduction of the mixed crystal SiGe layer and activation annealing at a heating/cooling rate of $10^{5°}$ C./sec or higher, while suppressing occurrence of dislocation and crystal defects. Accordingly, the same effects as those in the first embodiment can be obtained.

Ninth Embodiment

In the present embodiment, a semiconductor device is formed in a similar manner to the first embodiment. However, the present embodiment differs from the first embodiment in that a carbon introduction region into which carbon (C), which is a Group IV element, is introduced is provided in the vicinity of the epitaxially grown mixed crystal SiGe layer. Regarding carbon (C), the magnitude relationship of a lattice constant between Si and carbon (C) is opposite to that between Si and Ge, that is, the lattice constant of carbon (C) is smaller than that of Si.

Figure 20A:
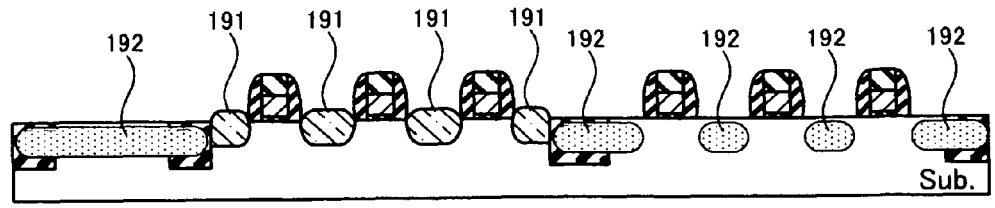
FIGS. 20A and 20B are sectional views showing semiconductor manufacturing processes according to an embodiment of the invention.

Through the same manufacturing processes as those in the first embodiment, a mixed crystal SiGe layer 191 is formed as shown in FIG. 20A. Subsequently, an impurity implantation layer is formed in the mixed crystal SiGe layer 191, in the same manner as in the first embodiment. Then, carbon (C) which is a Group IV element, is introduced into the vicinity of the mixed crystal SiGe layer 191 by an ion implantation method to form a carbon introduction region 192. At this point, the ion implantation conditions of carbon are the acceleration energy of 25 keV and the dosage of 5E14 $cm^{-2}$. Implantation of carbon may be prior to implantation of an impurity.

Figure 20B:
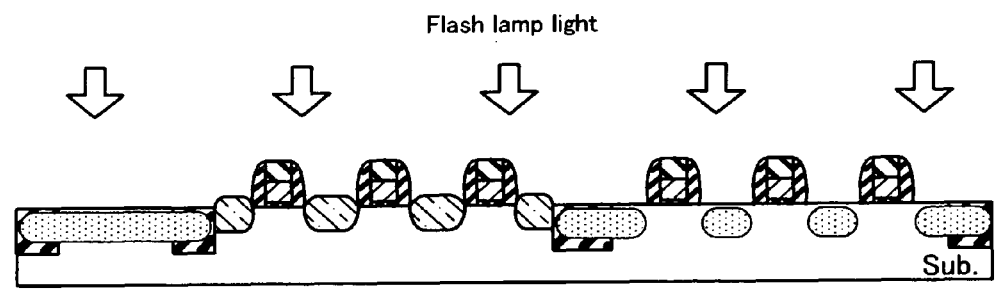

After several heat processes, activation annealing is performed using a flash lamp at a heating/cooling rate of $10^{5°}$ C./sec or higher at 1200° C. After activation annealing, dislocation does not occur in the mixed crystal SiGe layer 191, and dislocation propagation to an element region is not found as shown in FIG. 20B.

Figure 21A:
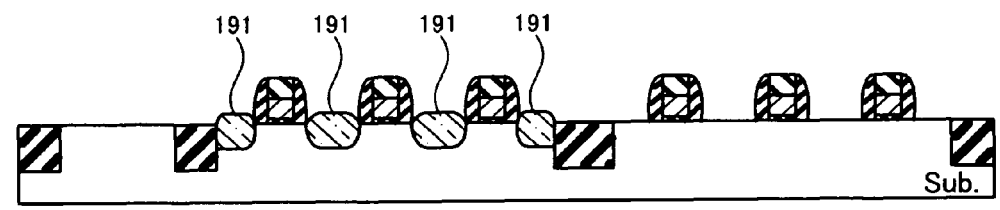
FIGS. 21A and 21B are sectional views showing semiconductor manufacturing processes in a comparative example.
Figure 21B:
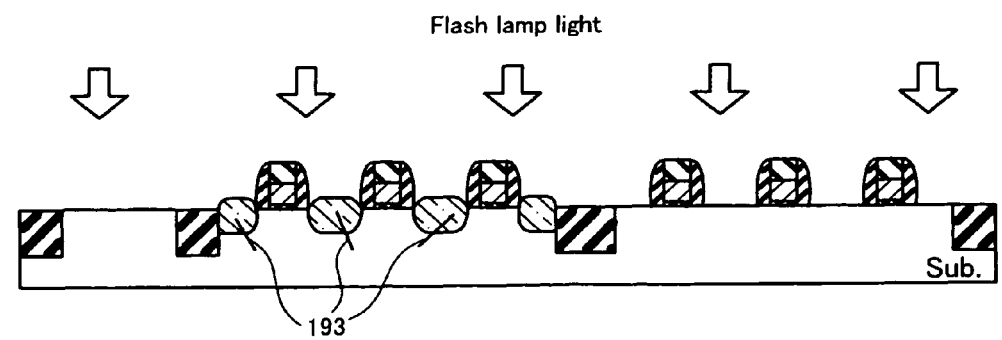

On the other hand, in the case where a carbon introduction region is not formed in the vicinity of the mixed crystal SiGe layer 191 as shown in FIG. 21A, activation annealing is similarly performed using a flash lamp. After activation annealing, dislocation 193 occurs in the mixed crystal SiGe layer 191 as shown in FIG. 21B. Accordingly, not only leakage current increases, but also a stress residing in the mixed crystal SiGe layer is lost, the mobility of holes propagating in a channel region does not increase, and drain current is not expected to increase.

Based on the above, it is found that dislocation can be suppressed by ion implantation of carbon (C). The atomic radius of carbon (C) is 70 pm, which is smaller than the atomic radius of Si, which is 110 pm. On the other hand, the atomic radius of Ge is 125 pm, which is larger than the atomic radius of Si. Therefore, mismatch and distortion of crystal lattices expanding in the mixed crystal SiGe layer are considered to be absorbed in a Si layer having carbon (C) which is ion implanted around the Si layer. As a result, it is considered that expansion of dislocation in activation annealing at a heating/cooling rate of $10^{5\circ}$ C./sec or higher can be suppressed, resulting in improvement in heat resistance margin.

Regarding ion implantation conditions of carbon (C), it is preferable that the carbon introduction region have a concentration peak of carbon (C) at a point corresponding to the depth at the SiGe/Si interface from the mixed crystal SiGe layer, and the concentration of carbon (C) at the concentration peak be $1E18$ $cm^{-3}$ to $1E21$ $cm^{-3}$. This is because the ratio of lattice mismatch with Si increases from the mixed crystal SiGe layer to the SiGe/Si interface. The concentration peak equal to or greater than $1E18$ $cm^{-3}$ causes carbon (C) to be captured into a location in a Si lattice, enabling correction of the mismatch of the crystal lattices expanding in the mixed crystal SiGe layer. The concentration peak equal to or less than $1E21$ $cm^{-3}$ reduces the quantity of interstitials of carbon (C) enabling suppression of crystal defects that can lead to dislocation by ion implantation of carbon (C) itself. Furthermore, it is preferable that an area of carbon (C) ion implantation by doping the ions around the mixed crystal SiGe layer be larger than an area of opening of the mixed crystal SiGe layer. This is because the larger area of carbon (C) ion implantation is, the more the mismatch ratio of the crystal lattices expanding in the mixed crystal SiGe layer can be suppressed.

The carbon introduction region into which carbon (C) is to be ion implanted needs to be in the vicinity of the mixed crystal SiGe layer. The vicinity of the mixed crystal SiGe layer means an area around the mixed crystal SiGe layer excluding the mixed crystal SiGe layer. When carbon (C) is implanted into the mixed crystal SiGe layer, or a layer containing carbon (C) is formed at the SiGe/Si interface, a stress to be provided by the mixed crystal SiGe layer is not provided because the Si layer containing carbon (C) and the mixed crystal SiGe layer have stresses opposite to each other. The efficiency of providing stresses is therefore decreased. This not only makes the process complex but also leads to introducing seeds of interstitial atoms and dislocation into the mixed crystal SiGe layer. This is likely to promote the occurrence of dislocation. The carbon introduction region may be an active element of the same conductivity type as an element having the mixed crystal SiGe layer, may also be an active element of a different conductivity type therefrom, and may also be a non-active element, since carbon (C) is a Group IV element, which has little influence on electric conduction.

Further, through the same processes as in the first embodiment, a semiconductor device is formed.

In the present embodiment, providing a carbon introduction region in the vicinity of the mixed crystal SiGe layer enables introduction of the mixed crystal SiGe layer and activation annealing at a heating/cooling rate of $10^{5\circ}$ C./sec or higher, while suppressing occurrence and expansion of dislocation. Accordingly, the same effects as those in the first embodiment can be obtained.

The case of introducing the mixed crystal SiGe layer in a p-MOSFET has been described in the present embodiment. However, the same can be applied to the case of introducing a silicon carbon (Si:C) layer in an n-MOSFET, which will be described later. In this case, since the magnitude relationship between C and Si used for applying a stress is inverse, a layer for introduction of Ge, which has a lattice constant greater than that of Si, may be formed in the vicinity of the silicon carbon (Si:C) layer.

In the second to ninth embodiments, it is possible to suppress plastic deformation without depending on the opening ratio of the mixed crystal SiGe layer. However, to obtain a wider process window, it is preferable that the opening ratio be 5 to 15%, like the first embodiment. More preferably, the opening ratio is 5 to 10%.

Activation annealing using a flash lamp is performed in these embodiments, and a Xe flash lamp is preferred as a heat light source. However, the heat light source is not limited to the Xe flash lamp, but may be a flash lamp using, for example, another rare gas, mercury or hydrogen; a laser such as an excimer laser, a YAG (Yttrium Aluminum Garnet) laser, carbon monoxide (CO) lasers and carbon dioxide ($CO_2$) lasers; or a light source that enables superluminescent light emitting, such as a Xe arc discharge lamp. Such light sources may also applied to heat treatment using conventional halogen lamps, electrical resistance heaters and the like if the heating/cooling rate can be controlled to be high.

A manufacturing method of a p-MOSFET has been mentioned as an example, and has been described using a mixed crystal SiGe layer as a stress application film in these embodiments. However, the stress application film is not limited to the mixed crystal SiGe layer, and may al so be applied to an n-MOS FET In the case of manufacturing an n-MOSFET, a silicon carbon (Si:C) layer made of Si and carbon (C) whose lattice constant is smaller than that of Si is formed instead of the mixed crystal SiGe layer. This enables a tensile stress to be applied to a channel region, enabling the driving force of the n-MOSFET to be improved. In this case, for example, phosphorus (P) or arsenic (As) of Group V, which serves as n-type impurity, is used as an impurity to be implanted.

Furthermore, a p-type Si substrate is used as a semiconductor substrate. However, a bulk, single-crystal wafer may not necessarily be used, and epitaxial wafers and SOI (Semiconductor On Insulator) wafers may be used.

Other embodiments of the invention will be apparent to those skilled in the art from consideration of the specification and practice of the invention disclosed herein. It is intended that the specification and examples be considered exemplary only, with a true scope and spirit of the invention being indicated by the following claims.

What is claimed is:

1. A semiconductor device comprising:
   a semiconductor substrate being composed of first atom;
   an opening formed in a surface of the semiconductor substrate and the opening having a ratio of the opening area to an area of the surface of the semiconductor substrate ranging from 5 to 15%; and
   an epitaxial layer formed in the opening, the epitaxial layer being made of a mixed crystal containing a second atom in a concentration ranging from 1 to 25%, the second atom having a lattice constant different from a lattice constant of an atom constituting the semiconductor substrate.

2. The semiconductor device according to claim 1, wherein an impurity ion concentration at an interface between the epitaxial layer and the semiconductor substrate is equal to or less than $1E18$ $cm^{-3}$ at least in the non-element region.

3. The semiconductor device according to claim 1, wherein the epitaxial layer includes an element region and a non-element region, the element region having a semiconductor element and the non-element region having an area larger than an area of the element region.

4. The semiconductor device according to claim 3, wherein a third atom has magnitude relationship in lattice constant to the first atom being different from a magnitude relationship in lattice constant between the second atom and the first atom, the third atom is a Group IV element, and the third atom is implanted in a vicinity of at least one of the element region and the non-element region.

5. The semiconductor device according to claim 3, wherein the non-element region has an impurity diffusion region having an area smaller than the opening area of the opening.

6. The semiconductor device according to claim 3, wherein an element isolation region is formed in the non-element region.

7. The semiconductor device according to claim 3, wherein the opening area of the opening in the non-element region is equal to or less than 5 $\mu m^2$.

* * * * *